(12) United States Patent
Nozawa et al.

(10) Patent No.: US 11,559,986 B2
(45) Date of Patent: Jan. 24, 2023

(54) LIQUID EJECTING APPARATUS AND CIRCUIT SUBSTRATE

(71) Applicant: SEIKO EPSON CORPORATION, Tokyo (JP)

(72) Inventors: Dai Nozawa, Nagano (JP); Yoichiro Kondo, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 25 days.

(21) Appl. No.: 17/133,775

(22) Filed: Dec. 24, 2020

(65) Prior Publication Data
US 2021/0197551 A1 Jul. 1, 2021

(30) Foreign Application Priority Data
Dec. 26, 2019 (JP) .............................. JP2019-235896

(51) Int. Cl.
*B41J 2/045* (2006.01)
*B41J 2/14* (2006.01)

(52) U.S. Cl.
CPC ....... *B41J 2/04541* (2013.01); *B41J 2/04581* (2013.01); *B41J 2/14201* (2013.01); *B41J 2002/14491* (2013.01); *B41J 2202/08* (2013.01); *B41J 2202/13* (2013.01)

(58) Field of Classification Search
None
See application file for complete search history.

(56) References Cited

U.S. PATENT DOCUMENTS

| 2006/0255440 | A1* | 11/2006 | Miyazaki | H01L 23/49822 257/679 |
| 2007/0070103 | A1* | 3/2007 | Akune | B41J 2/19 347/10 |
| 2008/0079776 | A1* | 4/2008 | Anderson | B41J 2/16 347/54 |
| 2015/0062220 | A1* | 3/2015 | Kashimura | B41J 2/04541 347/10 |
| 2015/0246530 | A1* | 9/2015 | Abe | B41J 2/04581 347/10 |

(Continued)

FOREIGN PATENT DOCUMENTS

| EP | 3378648 A1 | 9/2018 |
| JP | H04-010748 A | 1/1992 |
| JP | 2018-158488 A | 10/2018 |

*Primary Examiner* — Shelby L Fidler
(74) *Attorney, Agent, or Firm* — Global IP Counselors, LLP

(57) ABSTRACT

A liquid ejecting apparatus includes a drive element, and a drive circuit that outputs a drive signal that drives the drive element, wherein the drive circuit includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a base material includes a metal and a first layer laminated on the base material, wherein the first layer includes a first propagation wire through which at least one of the amplified modulation signal and the drive signal propagates, and wherein the base material has a thickness greater than a thickness of the first layer.

7 Claims, 14 Drawing Sheets

(56) References Cited

U.S. PATENT DOCUMENTS

2018/0086054 A1* 3/2018 Abe .................... B41J 2/04541
2018/0272696 A1 9/2018 Ito et al.
2018/0345658 A1* 12/2018 Shimono ................ B41J 2/0459

* cited by examiner

| [SIH, SIL] | | [1, 1]<br>LARGE DOT | [1, 0]<br>MEDIUM DOT | [0, 1]<br>SMALL DOT | [0, 0]<br>NO DOTS<br>RECORDED |
|---|---|---|---|---|---|
| S1 | T1 | H | H | H | L |
|  | T2 | H | L | L | L |
| S2 | T1 | L | L | L | H |
|  | T2 | L | H | L | L |

LIQUID EJECTING APPARATUS AND CIRCUIT SUBSTRATE

The present application is based on, and claims priority from JP Application Serial Number 2019-235896, filed Dec. 26, 2019, the disclosure of which is hereby incorporated by reference herein in its entirety.

BACKGROUND

1. Technical Field

The present disclosure relates to a liquid ejecting apparatus and a circuit substrate.

2. Related Art

An ink jet printer that prints an image or a document on a medium by ejecting ink as a liquid is known in which a piezoelectric element such as a piezo element is used. The piezoelectric element is provided corresponding to each of the plurality of nozzles in the head unit. A predetermined amount of ink is ejected from the corresponding nozzle at a predetermined timing by driving each of the piezoelectric elements in accordance with the drive signal. As a result, dots are formed on the medium. Such a piezoelectric element is electrically a capacitive load, such as a capacitor, and therefore, it is necessary to supply a sufficient current to operate the piezoelectric element corresponding to each nozzle.

In order to supply a sufficient current for operating the piezoelectric element, as a drive circuit, an amplifier circuit that amplifies the supplied original signal to output the amplified signal as a drive signal is used. Such an amplifier circuit may be a class A amplifier circuit, a class B amplifier circuit, a class AB amplifier circuit, or the like, but from the viewpoint of power consumption reduction in recent years, in some cases, a class D amplifier circuit that is superior in energy conversion efficiency to the class A amplifier circuit, the class B amplifier circuit, and the class AB amplifier circuit is used.

For example, JP-A-2018-158488 discloses a liquid ejecting apparatus including a class D amplifier circuit as a drive circuit that generates a drive signal for driving a piezoelectric element.

In recent years, the liquid ejecting apparatus has an increasing number of nozzles included in a print head from the viewpoint of improving print quality and printing speed. Therefore, the amount of current based on the drive signal output by the drive circuit included in the liquid ejecting apparatus increases, and as a result, heat generation of the drive circuit increases. The heat generated in such a drive circuit may cause characteristic deterioration of components consisting of the drive circuit or malfunction of the drive circuit due to the characteristic deterioration. That is, there is room for improvement in terms of efficiently releasing the heat generated in the drive circuit.

SUMMARY

According to an aspect of the present disclosure, a liquid ejecting apparatus includes a liquid ejection head including a drive element, where the liquid ejection head ejects a liquid by a supply of a drive signal to the drive element, and a drive circuit that outputs the drive signal, wherein the drive circuit includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a base material and a first layer laminated on a first face of the base material, wherein the base material includes a metal, wherein the first layer includes a first propagation wire through which at least one of the amplified modulation signal and the drive signal propagates, and wherein the base material has a thickness greater than a thickness of the first layer.

According to another aspect of the present disclosure, a circuit substrate includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a base material and a first layer laminated on a first face of the base material, wherein the base material includes a metal, wherein the first layer includes a first propagation wire through which at least one of the amplified modulation signal and the drive signal propagates, and wherein the base material has a thickness greater than a thickness of the first layer.

DESCRIPTION OF EXEMPLARY EMBODIMENTS

Hereinafter, preferred embodiments of the present disclosure will be described with reference to the drawings. The drawings used are for convenience of explanation. The embodiments described below do not unduly limit the details of the present disclosure described in the claims. In addition, all of the configurations described below are not necessarily essential components of the disclosure.

1. First Embodiment

1.1 Configuration of Liquid Ejecting Apparatus

Figure 1:
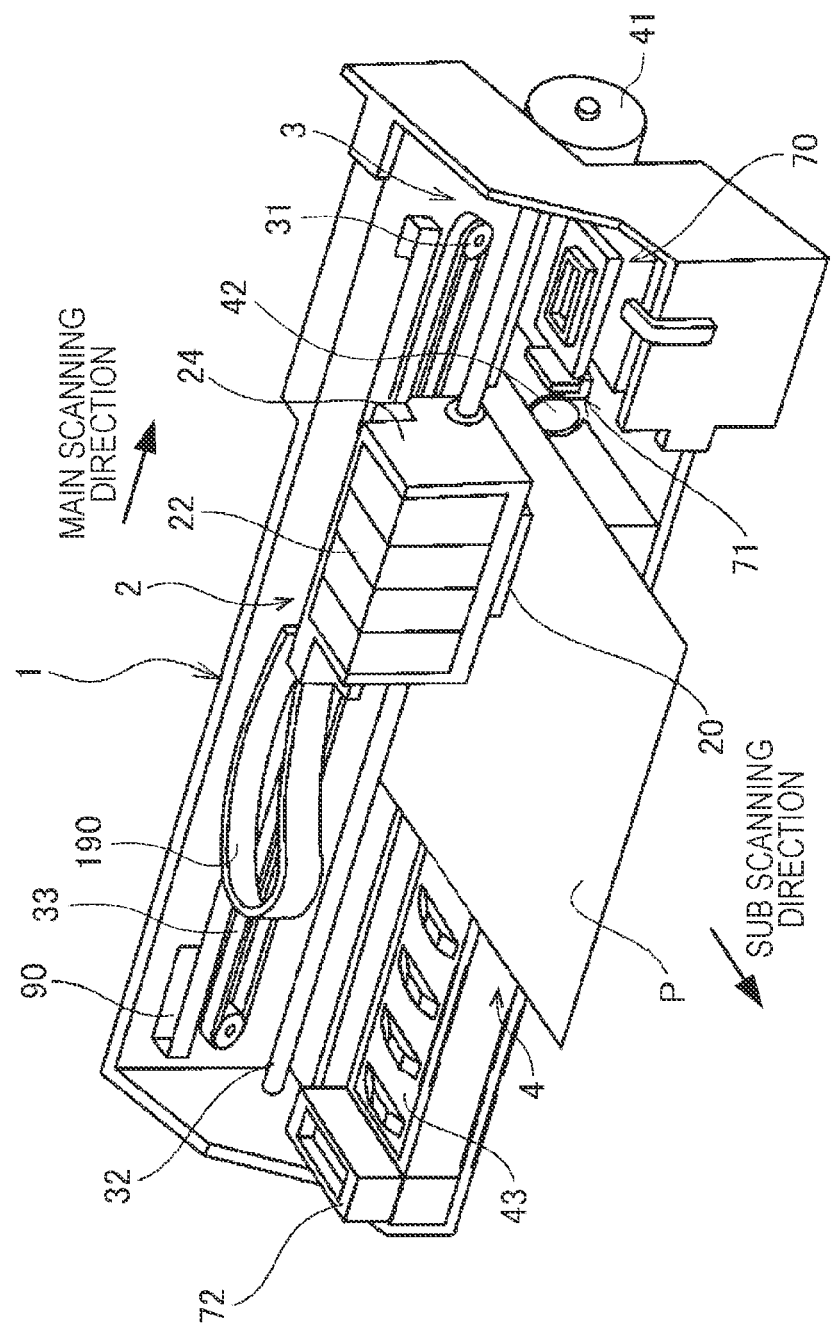
FIG. 1 is a diagram illustrating a schematic configuration of the inside of a liquid ejecting apparatus.

FIG. 1 is a diagram showing a schematic configuration of the inside of a liquid ejecting apparatus 1 of the present embodiment. The liquid ejecting apparatus 1 is an ink jet printer in which the ink as an example of a liquid is ejected in accordance with image data supplied from a host computer provided outside to form dots on a medium P such as paper, thereby printing an image according to the supplied image data. In FIG. 1, some of the components of the liquid ejecting apparatus 1 such as a housing and a cover are not shown.

As shown in FIG. 1, the liquid ejecting apparatus 1 includes a movement mechanism 3 that moves a head unit 2 in the main scanning direction. The movement mechanism 3 includes a carriage motor 31 serving as the driving source of the head unit 2, a carriage guide shaft 32 having both ends fixed, a timing belt 33 extending substantially parallel to the carriage guide shaft 32 and driven by the carriage motor 31. The movement mechanism 3 includes a linear encoder 90 that detects the position of the head unit 2 in the main scanning direction.

A carriage 24 of the head unit 2 is configured so that a predetermined number of ink cartridges 22 can be mounted thereon. The carriage 24 is reciprocably supported by the carriage guide shaft 32 and is fixed to a portion of the timing belt 33. Therefore, the carriage 24 of the head unit 2 is guided by the carriage guide shaft 32 and reciprocates when the carriage motor 31 causes the timing belt 33 to travel forward and backward. That is, the carriage motor 31 moves the carriage 24 in the main scanning direction. A print head 20 is attached to a portion, of the carriage 24, facing the medium P. As will be described later, the print head 20 includes a large number of nozzles, and ejects a predetermined amount of ink from each nozzle at a predetermined timing. Various control signals are supplied to the head unit 2 operating as described above via a cable 190 such as a flexible flat cable.

The liquid ejecting apparatus 1 includes a transport mechanism 4 that transports the medium P in the sub scanning direction. The transport mechanism 4 includes a platen 43 that supports the medium P, a transport motor 41 that is a driving source, and a transport roller 42 that is rotated by the transport motor 41 and transports a medium P in the sub scanning direction. In a state where the medium P is supported by the platen 43, the ink is ejected from the print head 20 onto the medium P according to the timing at which the medium P is transported by the transport mechanism 4, so that a desired image is formed on the surface of the medium P.

A home position serving as a base point of the head unit 2 is set in an end region within the movement range of the carriage 24 included in the head unit 2. A capping member 70 that seals the nozzle formation face of the print head 20 and a wiper member 71 that wipes the nozzle formation face are disposed at the home position. The liquid ejecting apparatus 1 forms an image on the surface of the medium P bidirectionally when the carriage 24 moves forward toward the end opposite the home position, and when the carriage 24 moves backward from the opposite end toward the home position.

A flushing box 72 that collects the ink ejected from the print head 20 during a flushing operation is provided at the end of the platen 43 in the main scanning direction, and at the end opposite the home position from which the carriage 24 moves. The flushing operation is an operation of forcibly ejecting the ink from each nozzle regardless of the image data in order to prevent the possibility that the proper amount of ink will not be ejected due to the nozzle clogging because of thickening of the ink near the nozzle, the air bubbles mixed in the nozzle, and the like. Note that the flushing boxes 72 may be provided on both sides of the platen 43 in the main scanning direction.

1.2 Electrical Configuration of Liquid Ejecting Apparatus

Figure 2:
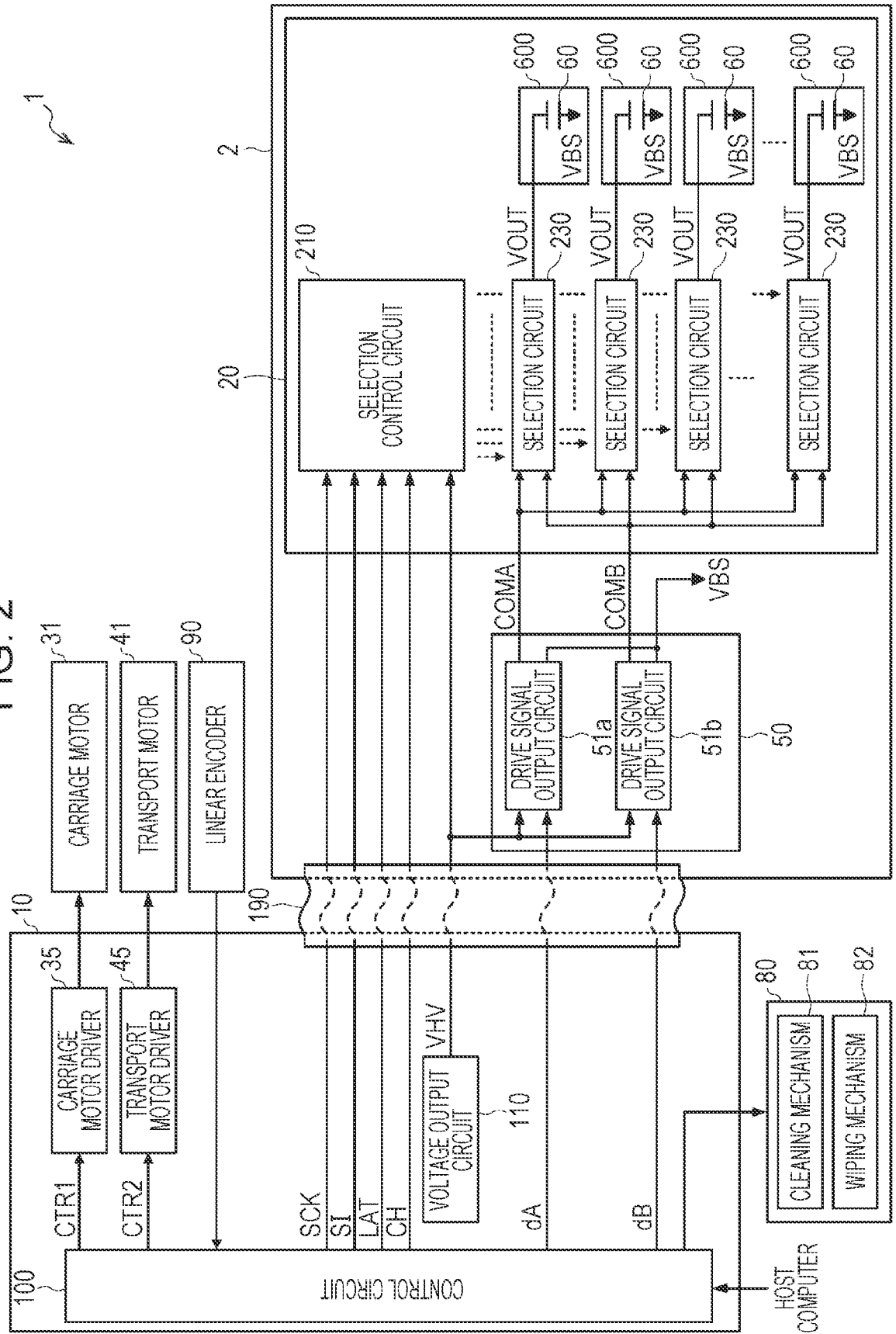
FIG. 2 is a diagram illustrating an electrical configuration of a liquid ejecting apparatus.

FIG. 2 is a diagram illustrating an electrical configuration of the liquid ejecting apparatus 1. As shown in FIG. 2, the liquid ejecting apparatus 1 includes a control unit 10 and the head unit 2. The control unit 10 and the head unit 2 are electrically coupled to each other via the cable 190.

The control unit 10 includes a control circuit 100, a carriage motor driver 35, a transport motor driver 45, and a voltage output circuit 110. The control circuit 100 generates various control signal corresponding to the image data supplied from the host computer to output the generated control signal to a corresponding configuration.

Specifically, the control circuit 100 grasps the current scanning position of the head unit 2 based on the detection signal of the linear encoder 90. The control circuit 100 generates control signals CTR1 and CTR2 corresponding to the current scanning position of the head unit 2. The control signal CTR1 is supplied to the carriage motor driver 35. The carriage motor driver 35 drives the carriage motor 31 according to the input control signal CTR1. Further, the control signal CTR2 is supplied to the transport motor driver 45. The transport motor driver 45 drives the transport motor 41 according to the input control signal CTR2. As a result, the movement of the carriage 24 in the main scanning direction and the transport of the medium P in the sub scanning direction are controlled.

In addition, the control circuit 100 generates, based on image data supplied from an externally provided host computer and a detection signal of the linear encoder 90, a clock signal SCK, a print data signal SI, a latch signal LAT, a change signal CH, and base drive signals dA and dB corresponding to the current scanning position of the head unit 2 to output the generated signals to head unit 2.

Further, the control circuit 100 causes a maintenance unit 80 to perform a maintenance process of restoring the ink ejection state of an ejection unit 600 to a normal state. The maintenance unit 80 includes a cleaning mechanism 81 and a wiping mechanism 82. The cleaning mechanism 81 performs, as a maintenance process, a pumping process for sucking thickened ink, air bubbles, and the like stored in the ejection unit 600 with a tube pump (not shown). Further, the wiping mechanism 82 performs, as a maintenance process, a wiping process of wiping foreign matter such as paper dust attached to the vicinity of the nozzle of the ejection unit 600 with the wiper member 71. The control circuit 100 may perform the above-described flushing operation as a maintenance process of restoring the ink ejection state of the ejection unit 600 to a normal state.

The voltage output circuit 110 generates a voltage VHV of a DC voltage of, for example, 42 V to output it to the head unit 2. The voltage VHV is used as a power supply voltage for various configurations of the head unit 2. Further, the voltage VHV generated by the voltage output circuit 110 may be used as a power supply voltage for various configurations of the control unit 10. Furthermore, the voltage output circuit 110 may generate a plurality of DC voltage signals having different voltage values from the voltage VHV and supply the generated DC voltage signals to the components included in the control unit 10 and the head unit 2.

The head unit 2 includes a drive circuit 50 and the print head 20.

The drive circuit 50 includes drive signal output circuits 51a and 51b. A digital base drive signal dA and the voltage VHV are input to the drive signal output circuit 51a. The drive signal output circuit 51a generates a drive signal COMA by digital-to-analog converting the input base drive signal dA to class-D amplify the converted analog signal to a voltage value corresponding to the voltage VHV. Then, the drive signal output circuit 51a outputs the generated drive signal COMA to the print head 20. Similarly, a digital base drive signal dB and the voltage VHV are input to the drive signal output circuit 51b. The drive signal output circuit 51b generates a drive signal COMB by digital-to-analog converting the input base drive signal dB to class-D amplify the converted analog signal to a voltage value corresponding to the voltage VHV. Then, the drive signal output circuit 51b outputs the generated drive signal COMB to the print head 20.

That is, the base drive signal dA defines the waveform of the drive signal COMA, and the base drive signal dB defines the waveform of the drive signal COMB. Therefore, the base drive signals dA and dB may be signals that can define the waveforms of the drive signals COMA and COMB, and may be analog signals, for example. The details of the drive signal output circuits 51a and 51b will be described later. Further, in the description of FIG. 2, the drive circuit 50 is described as being included in the head unit 2, but the drive circuit 50 may be included in the control unit 10. In this case, the drive signals COMA and COMB output from the drive signal output circuits 51a and 51b are supplied to the print head 20 via the cable 190.

The drive circuit 50 generates a constant reference voltage signal VBS having a voltage value of 5.5 V, 6 V, or the like to supply it to the print head 20. The reference voltage signal VBS is a signal of a potential serving as a reference for driving a piezoelectric element 60, and may be, for example, a signal of a ground potential.

The print head 20 includes a selection control circuit 210, a plurality of selection circuits 230, and a plurality of ejection units 600 corresponding to the plurality of respective selection circuits 230. The selection control circuit 210 generates, based on the clock signal SCK, the print data signal SI, the latch signal LAT, and the change signal CH supplied from the control circuit 100, a selection signal for selecting or deselecting the waveforms of the drive signals COMA and COMB to output the generated selection signal to each of the plurality of selection circuits 230.

The drive signals COMA and COMB and the selection signal output from the selection control circuit 210 are input to each selection circuit 230. By selecting or deselecting the waveforms of the drive signals COMA and COMB based on the input selection signal, the selection circuit 230 generates a drive signal VOUT based on the drive signals COMA and COMB to output the generated drive signal VOUT to the corresponding ejection unit 600.

Each ejection unit 600 includes a piezoelectric element 60. The drive signal VOUT output from the corresponding selection circuit 230 is supplied to one end of the piezoelectric element 60. Further, the constant reference voltage signal VBS having a voltage value of, for example 5.5 V is supplied to the other end of the piezoelectric element 60. The piezoelectric element 60 included in the ejection unit 600 is driven according to a potential difference between the drive signal VOUT supplied to the one end and the reference voltage signal VBS supplied to the other end. As a result, the amount of ink corresponding to the driving of the piezoelectric element 60 is ejected from the ejection unit 600.

Here, the piezoelectric element 60 is an example of a drive element, and the drive signal VOUT that is supplied to the piezoelectric element 60 is an example of a drive signal. In addition, as described above, the drive signal VOUT is generated by selecting or deselecting the waveforms of the drive signals COMA and COMB. Therefore, at least one of the drive signals COMA and COMB is also an example of the drive signal. The drive circuit 50 including the drive signal output circuits 51a and 51b that output the drive signals COMA and COMB is an example of a drive circuit, and the print head 20 that ejects the ink by a supply of the drive signal VOUT to the piezoelectric element 60 is an example of a liquid ejection head.

1.3 Configuration of Ejection Unit

Figure 3:
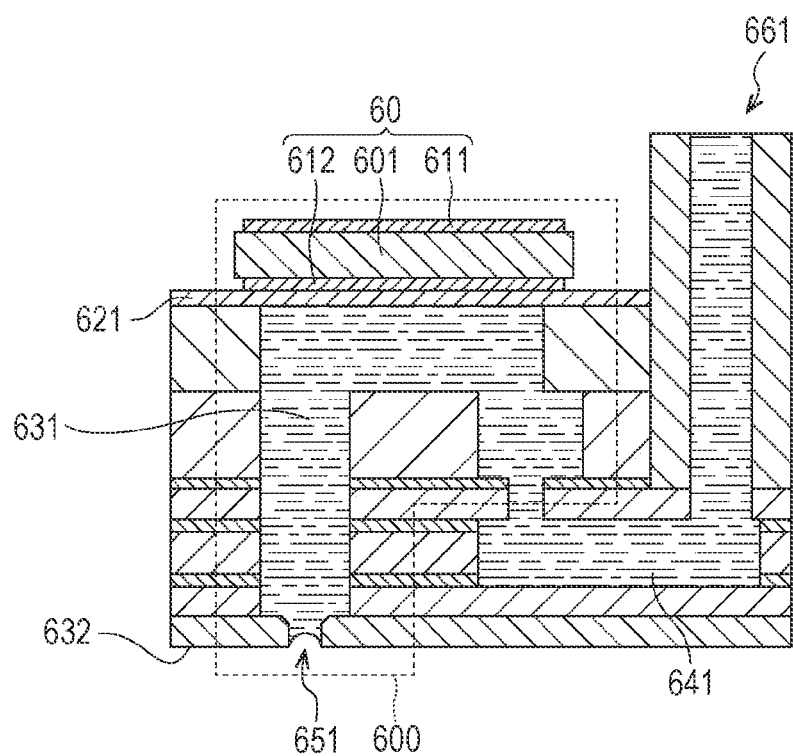
FIG. 3 is a diagram illustrating a schematic configuration of one of ejection units.

Next, the configuration of the ejection unit 600 included in the print head 20 will be described. FIG. 3 is a diagram illustrating a schematic configuration of one ejection unit 600 of the plurality of ejection units 600 included in the print head 20. As shown in FIG. 3, the ejection unit 600 includes the piezoelectric element 60, a vibration plate 621, a cavity 631, and a nozzle 651.

The cavity 631 is filled with ink supplied from a reservoir 641. Further, the ink is introduced into the reservoir 641 from the ink cartridge 22 via an ink tube (not shown) and a supply port 661. That is, the cavity 631 is filled with the ink stored in the corresponding ink cartridge 22.

The vibration plate 621 is displaced by driving the piezoelectric element 60 provided on the upper face in FIG. 3. With the displacement of the vibration plate 621, the internal volume of the cavity 631 filled with the ink expands or contracts. That is, the vibration plate 621 functions as a diaphragm that changes the internal volume of the cavity 631.

The nozzle 651 is an opening provided in a nozzle plate 632 and communicating with the cavity 631. When the internal volume of the cavity 631 changes, the amount of ink corresponding to the change in the internal volume is ejected from the nozzle 651.

The piezoelectric element 60 has a structure in which a piezoelectric body 601 is sandwiched between a pair of electrodes 611 and 612. In the piezoelectric body 601 having such a structure, the central portions of the electrodes 611 and 612 bend together with the vibration plate 621 in the vertical direction according to the potential difference of the voltage supplied by the electrodes 611 and 612. Specifically, the drive signal VOUT is supplied to the electrode 611 of the piezoelectric element 60. Further, the reference voltage signal VBS is supplied to the electrode 612 of the piezoelectric element 60. The piezoelectric element 60 bends upward when the voltage level of the drive signal VOUT increases, and bends downward when the voltage level of the drive signal VOUT decreases.

In the ejection unit 600 configured as described above, when the piezoelectric element 60 bends upward, the vibration plate 621 is displaced to increase the internal volume of the cavity 631. As a result, the ink is drawn from the reservoir 641. On the other hand, when the piezoelectric element 60 bends downward, the vibration plate 621 is displaced to reduce the internal volume of the cavity 631. As a result, the amount of ink corresponding to the degree of reduction is ejected from the nozzle 651. That is, the print head 20 includes the electrode 611 and the electrode 612, includes the piezoelectric element 60 driven by the potential difference between the electrode 611 and the electrode 612, and ejects the ink by driving the piezoelectric element 60.

Here, the piezoelectric element 60 is not limited to the structure shown in FIG. 3, but may have any structure as long as it can eject the ink from the ejection unit 600. Therefore, the piezoelectric element 60 is not limited to the above-described configuration of the bending vibration, but may be, for example, a configuration using the longitudinal vibration.

1.4 Configuration and Operation of Print Head

Next, the configuration and operation of the print head 20 will be described. As described above, the print head 20 generates the drive signal VOUT by selecting or deselecting the drive signals COMA and COMB output from the drive circuit 50 based on the clock signal SCK, the print data signal SI, the latch signal LAT, and the change signal CH to supply the generated drive signal VOUT to the corresponding ejection unit 600. Therefore, in describing the configuration and operation of the print head 20, first, an example of the waveforms of the drive signals COMA and COMB and an example of the waveform of the drive signal VOUT will be described.

Figure 4:
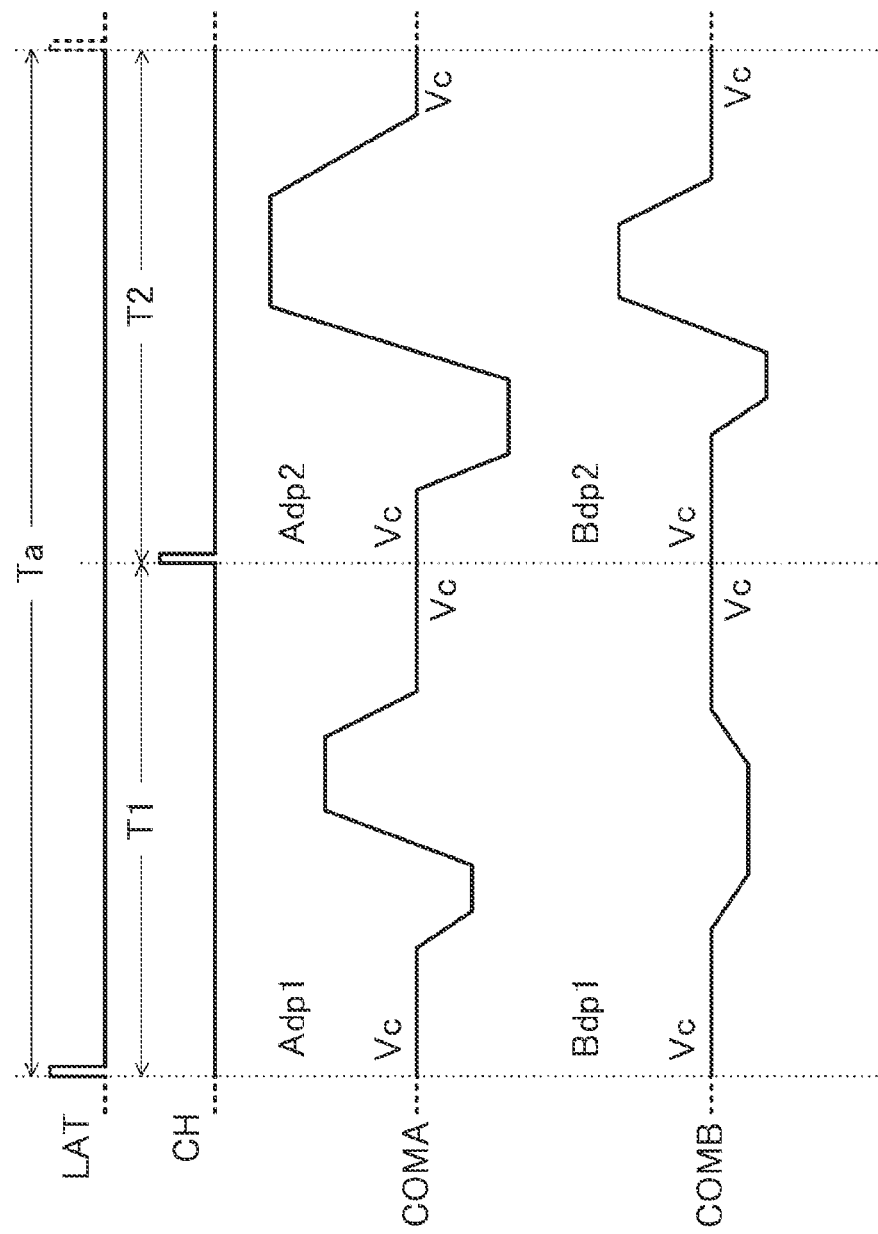
FIG. 4 is a diagram illustrating an example of waveforms of drive signals COMA and COMB.

FIG. 4 is a diagram illustrating an example of the waveforms of the drive signals COMA and COMB. As shown in FIG. 4, the drive signal COMA includes a waveform in which a trapezoidal waveform Adp1 disposed in a period T1 from the rise of the latch signal LAT to the rise of the change signal CH, and a trapezoidal waveform Adp2 disposed in a period T2 from the rise of the change signal CH to the rise of the latch signal LAT are made to be continuous. The trapezoidal waveform Adp1 is a waveform for ejecting a small amount of ink from the nozzle 651, and the trapezoidal waveform Adp2 is a waveform for ejecting a medium amount of ink that is larger than the small amount of ink from the nozzle 651.

Further, the drive signal COMB includes a waveform in which a trapezoidal waveform Bdp1 disposed in the period T1 and a trapezoidal waveform Bdp2 disposed in the period T2 are made to be continuous. The trapezoidal waveform Bdp1 is a waveform that does not eject the ink from the nozzle 651, and that slightly vibrates the ink in the vicinity of the opening of the nozzle 651 to prevent an increase in ink viscosity. Further, as in the trapezoidal waveform Adp1, the trapezoidal waveform Bdp2 is a waveform for ejecting a small amount of ink from the nozzles 651.

The voltages at the start timing and the end timing of each of the trapezoidal waveforms Adp1, Adp2, Bdp1, and Bdp2 are commonly a voltage Vc. That is, each of the trapezoidal waveforms Adp1, Adp2, Bdp1, Bdp2 has a waveform that starts at the voltage Vc and ends at the voltage Vc. A cycle Ta including the period T1 and the period T2 corresponds to a printing cycle in which a new dot is formed on the medium P.

Here, in FIG. 4, the trapezoidal waveform Adp1 and the trapezoidal waveform Bdp2 are identical, but the trapezoidal waveform Adp1 and the trapezoidal waveform Bdp2 may be different. Further, the description is made assuming that a small amount of ink is ejected from the corresponding nozzle 651 when the trapezoidal waveform Adp1 is supplied to the ejection unit 600, and when the trapezoidal waveform Bdp1 is supplied to the ejection unit 600, but different amounts of the ink may be ejected. That is, the waveforms of the drive signals COMA and COMB are not limited to the waveforms shown in FIG. 4, but various waveforms may be combined depending on the moving speed of the carriage 24 to which the print head 20 is attached, the nature of the ink stored in the ink cartridge 22, the material of the medium P, and the like.

Figure 5:
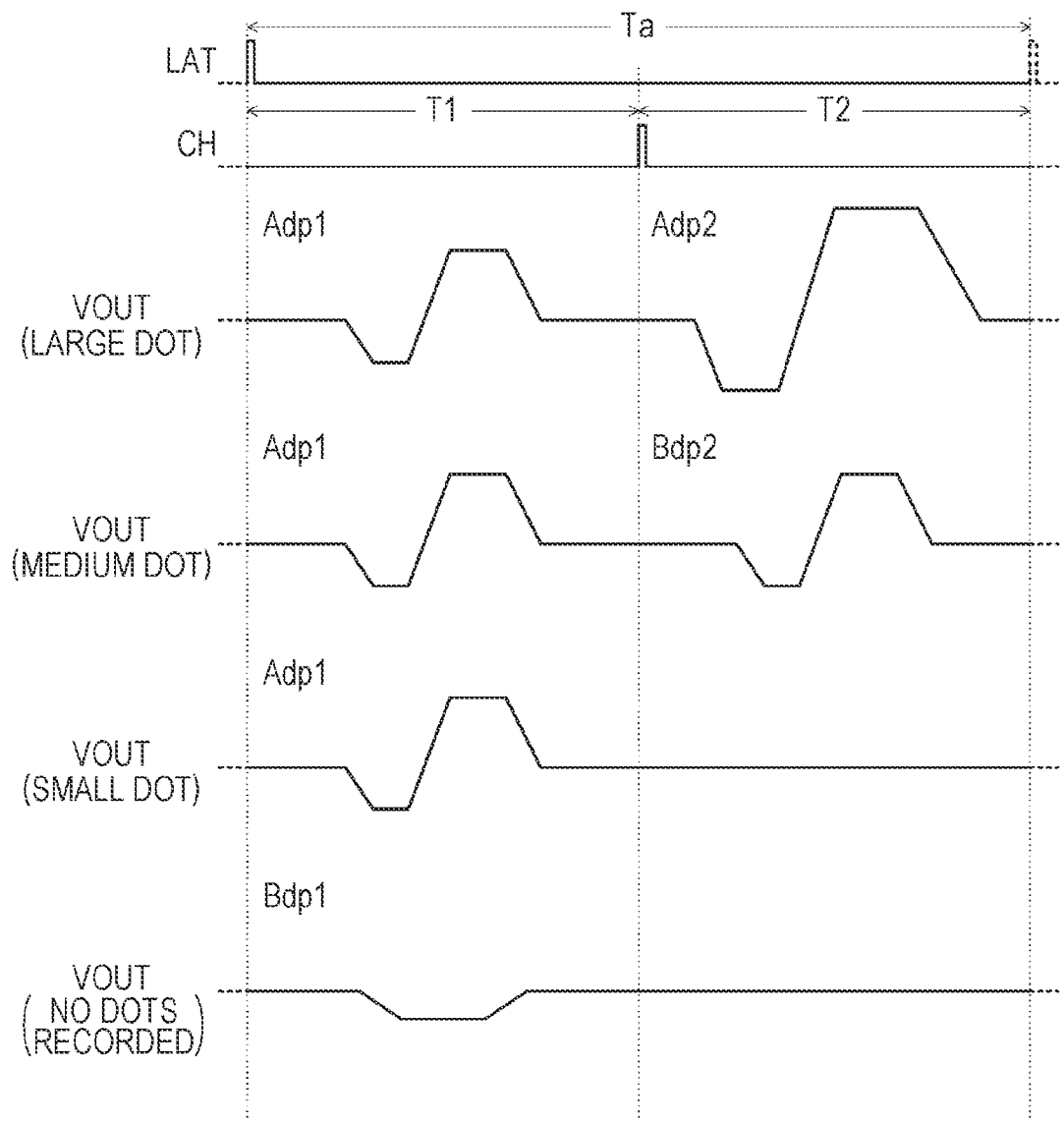
FIG. 5 is a diagram illustrating an example of waveforms of a drive signal VOUT.

FIG. 5 is a diagram illustrating an example of the waveform of the drive signal VOUT. FIG. 5 shows the waveforms of the drive signal VOUT with the dots formed on the medium P having the sizes of the "large dot", the "medium dot", and the "small dot", and having "no dots recorded" in comparison.

As shown in FIG. 5, the drive signal VOUT when the "large dot" is formed on the medium P represents a waveform in the cycle Ta in which the trapezoidal waveform Adp1 disposed in the period T1, and the trapezoidal waveform Adp2 disposed in the period T2 are made to be continuous. When the drive signal VOUT is supplied to the ejection unit 600, a small amount of ink and a medium amount of ink are ejected from the corresponding nozzle 651 in the cycle Ta. Therefore, the large dot is formed on the medium P by landing and uniting the respective amounts of the ink.

The drive signal VOUT when the "medium dot" is formed on the medium P represents a waveform in the cycle Ta in which the trapezoidal waveform Adp1 disposed in the period T1, and the trapezoidal waveform Bdp2 disposed in the period T2 are made to be continuous. When the drive signal VOUT is supplied to the ejection unit 600, a small amount of ink is ejected twice from the corresponding nozzle 651 in the cycle Ta. Therefore, the medium dot is formed on the medium P by landing and uniting the respective amounts of the ink.

The drive signal VOUT when the "small dot" is formed on the medium P represents a waveform in the cycle Ta in which the trapezoidal waveform Adp1 disposed in the period T1, and a constant waveform, with the voltage Vc, disposed in the period T2 are made to be continuous. When the drive signal VOUT is supplied to the ejection unit 600, a small amount of ink is ejected from the corresponding nozzle 651 in the cycle Ta. Therefore, this amount of ink lands on the medium P to form the small dot.

The drive signal VOUT corresponding to the "no dots recorded" in which no dots are formed on the medium P represents a waveform in the cycle Ta in which the trapezoidal waveform Bdp1 disposed in period T1, and a constant waveform, with the voltage Vc, disposed in the period T2 are made to be continuous. When the drive signal VOUT is supplied to the ejection unit 600, the ink near the opening of the corresponding nozzle 651 only slightly vibrates, and no ink is ejected in the cycle Ta. Therefore, the ink does not land on the medium P and no dots are formed.

Here, the waveform that is constant at the voltage Vc is a waveform with a voltage of the immediately preceding voltage Vc being held in the piezoelectric element 60, which is a capacitive load, when none of the trapezoidal waveforms Adp1, Adp2, Bdp1, and Bdp2 is selected as the drive signal VOUT. Therefore, when none of the trapezoidal waveforms Adp1, Adp2, Bdp1, and Bdp2 is selected as the drive signal VOUT, it can be said that the voltage Vc is supplied to the ejection unit 600 as the drive signal VOUT.

The drive signal VOUT as described above is generated when the waveforms of the drive signals COMA and COMB are selected or deselected by the operation of the selection control circuit 210 and the selection circuit 230.

Figure 6:
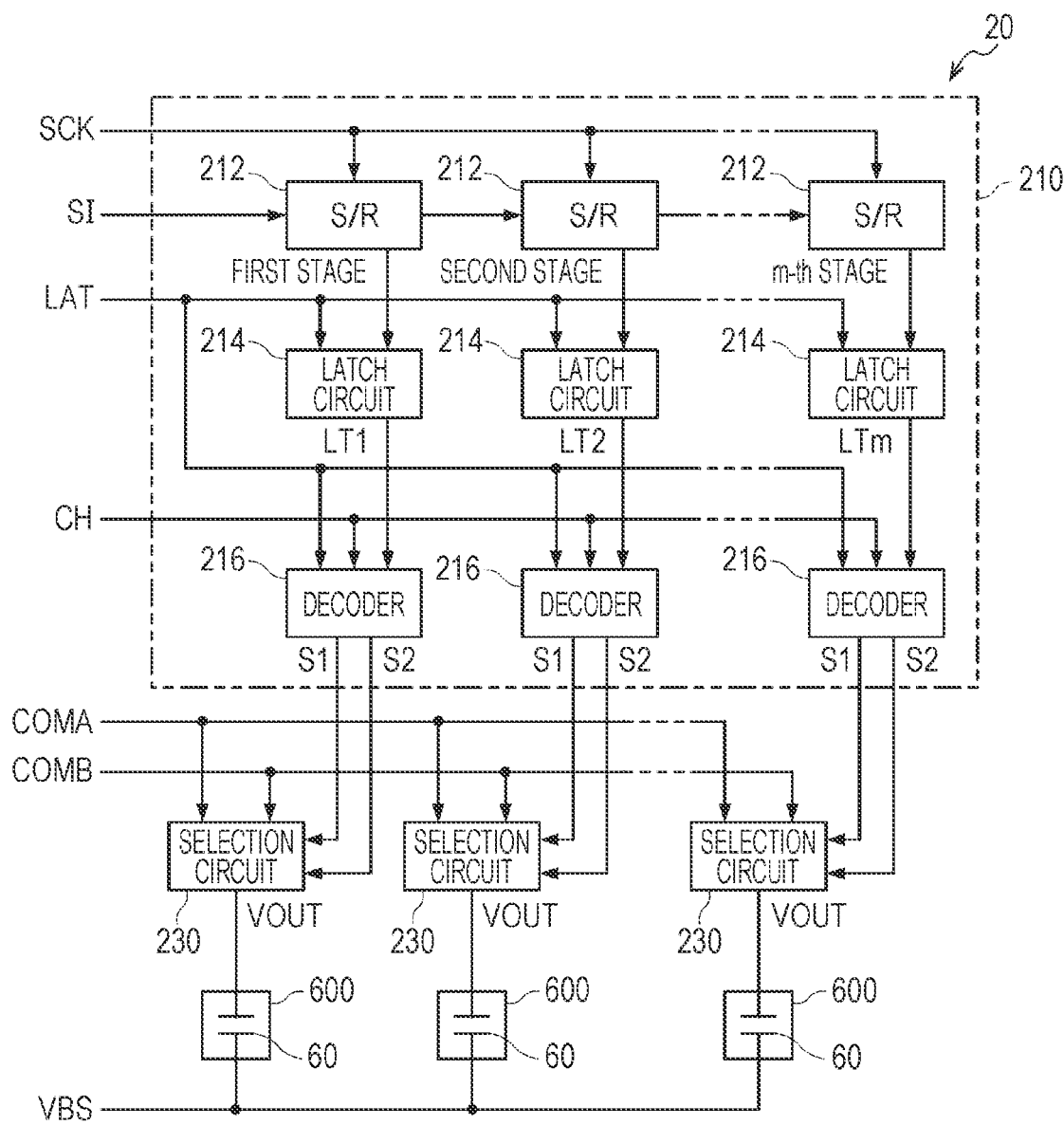
FIG. 6 is a diagram illustrating a configuration of a selection control circuit and a selection circuit.

FIG. 6 is a diagram illustrating configurations of the selection control circuit 210 and the selection circuits 230.

As shown in FIG. 6, the print data signal SI, the latch signal LAT, the change signal CH, and the clock signal SCK are input to the selection control circuit 210. The selection control circuit 210 includes a set of a shift register (SIR) 212, a latch circuit 214, and a decoder 216 corresponding to each of the m ejection units 600. That is, the selection control circuit 210 includes the same number of sets of the shift registers 212, the latch circuits 214, and the decoders 216 as the m ejection units 600.

The print data signal SI is a signal synchronized with the clock signal SCK, and is a total 2·m-bit signal including 2-bit print data [SIH, SIL] for selecting any one of the "large dot", the "medium dot", the "small dot", and the "no dots recorded" for each of the m ejection units 600. The input print data signal SI is held in the shift register 212 for 2-bit print data [SIH, SIL] included in the print data signal SI corresponding to each of the m ejection units 600. Specifically, the selection control circuit 210 is configured such that the m-stage shift registers 212 corresponding to the m ejection units 600 are cascade-coupled to each other, and the print data signal SI input serially is sequentially transferred to the subsequent stage according to the clock signal SCK. In FIG. 6, in order to distinguish the shift registers 212, they are denoted as the first stage, the second stage . . . the m-th stage in order from the upstream shift register to which the print data signal SI is input.

The m latch circuits 214 latches the 2-bit print data [SIH, SIL] held by the respective m shift registers 212 at the rising edge of the latch signal LAT.

Figures 7, 8:
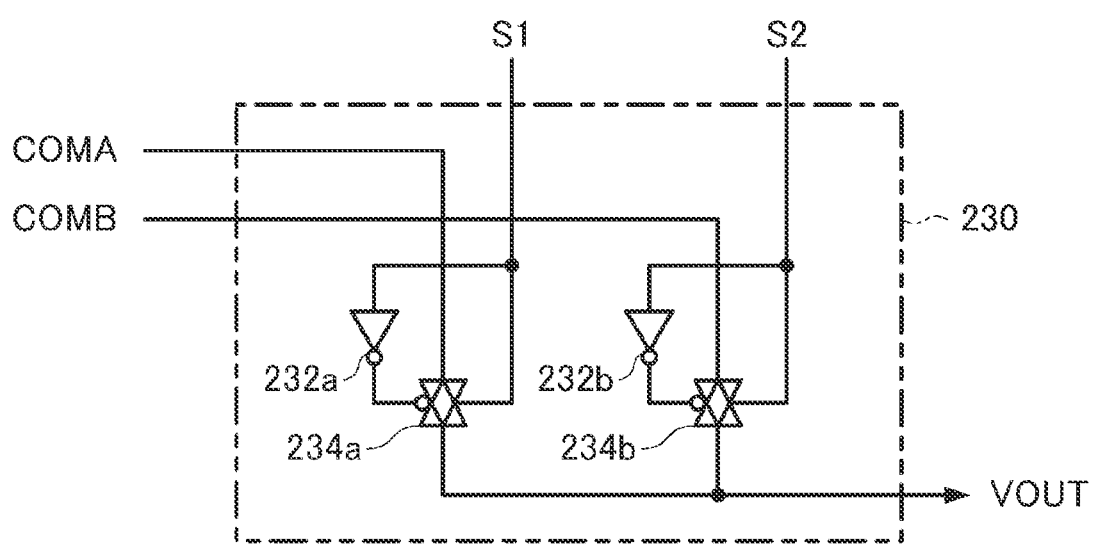
FIG. 7 is a diagram illustrating the decoding contents in a decoder.
FIG. 8 is a diagram illustrating a configuration of a selection circuit.

FIG. 7 is a diagram illustrating the decoding contents in the decoder 216. The decoder 216 outputs selection signals S1 and S2 according to the 2-bit print data [SIH, SIL] latched by the latch circuit 214. For example, when the 2-bit print data [SIH, SIL] is [1, 0], the decoder 216 outputs the logic level of the selection signal S1 as H and L levels in the periods T1 and T2, and the logic level of the selection signal S2 as L and H levels in the periods T1 and T2 to the selection circuit 230.

The selection circuit 230 is provided corresponding to each of the ejection units 600. That is, the number of the selection circuits 230 included in the print head 20 is m, which is the same as the total number of the ejection units 600. FIG. 8 is a diagram illustrating a configuration of the selection circuit 230 corresponding to one ejection unit 600. As shown in FIG. 8, the selection circuit 230 includes inverters 232a and 232b, which are NOT circuits, and transfer gates 234a and 234b.

The selection signal S1 is input to the non-circled positive control end in the transfer gate 234a, while being input to the circled negative control end in the transfer gate 234a after logically inverted by the inverter 232a. The drive signal COMA is supplied to the input end of the transfer gate 234a. The selection signal S2 is input to the non-circled positive control end in the transfer gate 234b, while being input to the circled negative control end in the transfer gate 234b after logically inverted by the inverter 232b. The drive signal COMB is supplied to the input end of the transfer gate 234b. The output ends of the transfer gates 234a and 234b are coupled in common and the drive signal COMA and the drive signal COMB are output as the drive signal VOUT.

Specifically, when the selection signal S1 is at H level, the transfer gate 234a brings the input end and the output end into a conductive state therebetween, and when the selection signal S1 is at L level, the transfer gate 234a brings the input end and the output end into a non-conductive state therebetween. When the selection signal S2 is at H level, the transfer gate 234b brings the input end and the output end into a conductive state therebetween, and when the selection signal S2 is at L level, the transfer gate 234b brings the input end and the output end into a non-conductive state therebetween. As described above, the selection circuit 230 generates and output the drive signal VOUT by selecting the waveforms of the drive signals COMA and COMB based on the selection signals S1 and S2.

Figure 9:
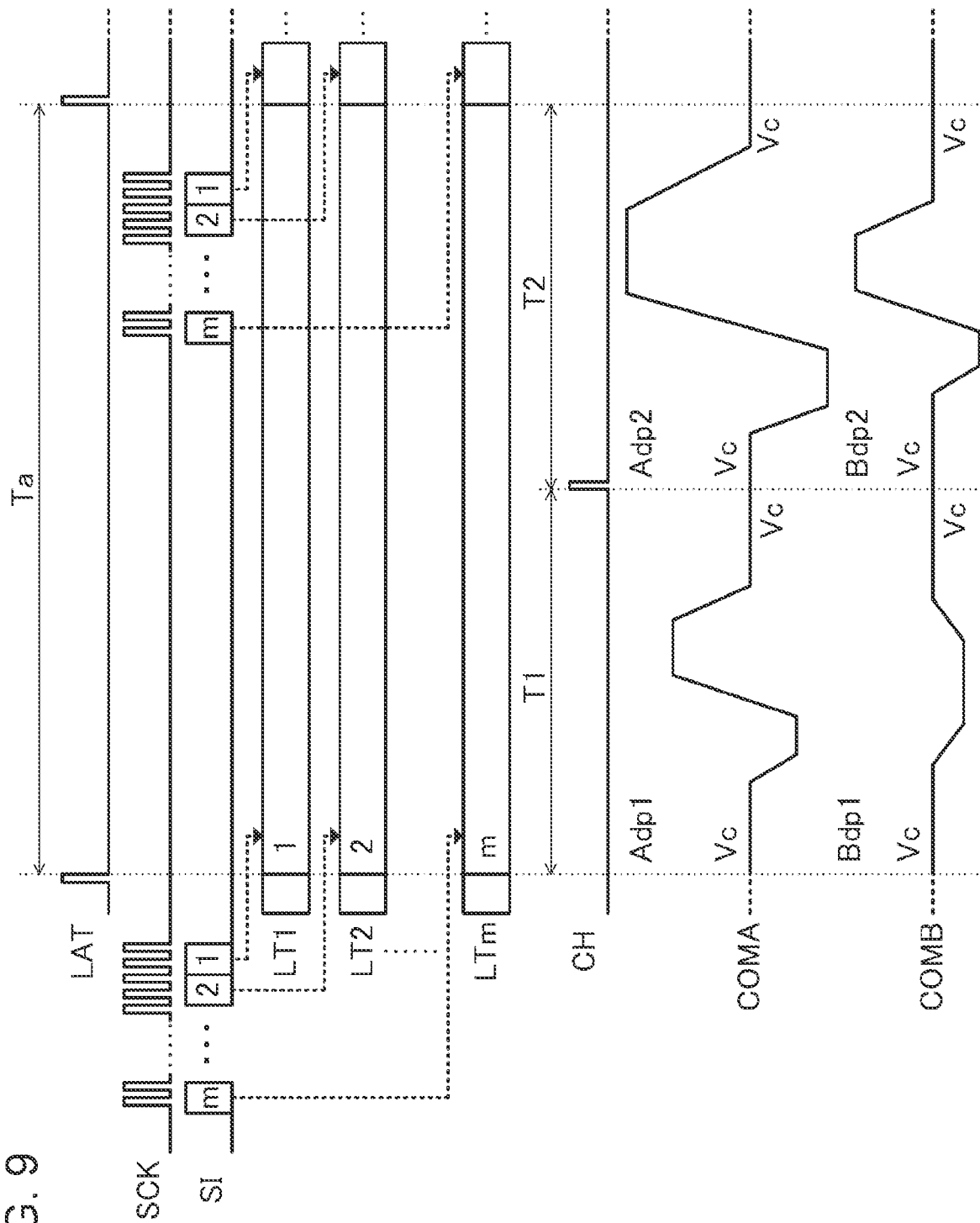
FIG. 9 is a diagram for explaining an operation of the selection control circuit and the selection circuit.

Here, operations of the selection control circuit 210 and the selection circuit 230 will be described with reference to FIG. 9. FIG. 9 is a diagram for explaining the operations of the selection control circuit 210 and the selection circuit 230. The print data signal SI is serially input in synchronization with the clock signal SCK, and is sequentially transferred to the shift registers 212 corresponding to the respective ejection units 600. When the input of the clock signal SCK stops, each shift register 212 holds 2-bit print data [SIH, SIL] corresponding to each of the ejection units 600. The print data signal SI is input to the shift registers 212 of the m-th stage . . . the second stage, the first-stage in the order of the corresponding ejection units 600.

When the latch signal LAT rises, each of the latch circuits 214 simultaneously latches the 2-bit print data [SIH, SIL] held in the respective shift registers 212. In FIG. 9, LT1, LT2 . . . LTm indicate 2-bit print data [SIH, SIL] latched by the latch circuits 214 corresponding to the shift registers 212 of the first stage, the second stage . . . the m-th stage, respectively.

The decoder 216 outputs the logic levels of the selection signals S1 and S2 in accordance with the contents as shown in FIG. 7 in each of the periods T1 and T2 according to a dot size defined by the latched 2-bit print data [SIH, SIL].

Specifically, when the print data [SIH, SIL] is [1, 1], the decoder 216 sets the selection signal S1 to H and H levels in the periods T1 and T2, and sets the selection signal S2 to L and L levels in the periods T1 and T2. In this case, the selection circuit 230 selects the trapezoidal waveform Adp1 in the period T1, and selects the trapezoidal waveform Adp2 in the period T2. As a result, the drive signal VOUT corresponding to the "large dot" shown in FIG. 5 is generated.

Also, when the print data [SIH, SIL] is [1, 0], the decoder 216 sets the selection signal S1 to H and L levels in the periods T1 and T2, and sets the selection signal S2 to L and H levels in the periods T1 and T2. In this case, the selection circuit 230 selects the trapezoidal waveform Adp1 in the period T1, and selects the trapezoidal waveform Bdp2 in the period T2. As a result, the drive signal VOUT corresponding to the "medium dot" shown in FIG. 5 is generated.

Further, when the print data [SIH, SIL] is [0, 1], the decoder 216 sets the selection signal S1 to H and L levels in the periods T1 and T2, and sets the selection signal S2 to L and L levels in the periods T1 and T2. In this case, the selection circuit 230 selects the trapezoidal waveform Adp1 in the period T1, and selects none of the trapezoidal waveforms Adp2 and Bdp2 in the period T2. As a result, the drive signal VOUT corresponding to the "small dot" shown in FIG. 5 is generated.

Further, when the print data [SIH, SIL] is [0, 0], the decoder 216 sets the selection signal S1 to L and L levels in the periods T1 and T2, and sets the selection signal S2 to H and L levels in the periods T1 and T2. In this case, the selection circuit 230 selects the trapezoidal waveform Bdp1 in the period T1, and selects none of the trapezoidal waveforms Adp2 and Bdp2 in the period T2. As a result, the drive signal VOUT corresponding to "no dots recorded" shown in FIG. 5 is generated.

As mentioned above, the selection control circuit 210 and the selection circuit 230 select the waveforms of the drive signals COMA and COMB based on the print data signal SI, the latch signal LAT, the change signal CH, and the clock signal SCK to output the selected waveforms as the drive signal VOUT to the ejection unit 600.

1.5 Configuration of Drive Signal Output Circuit

Figure 10:
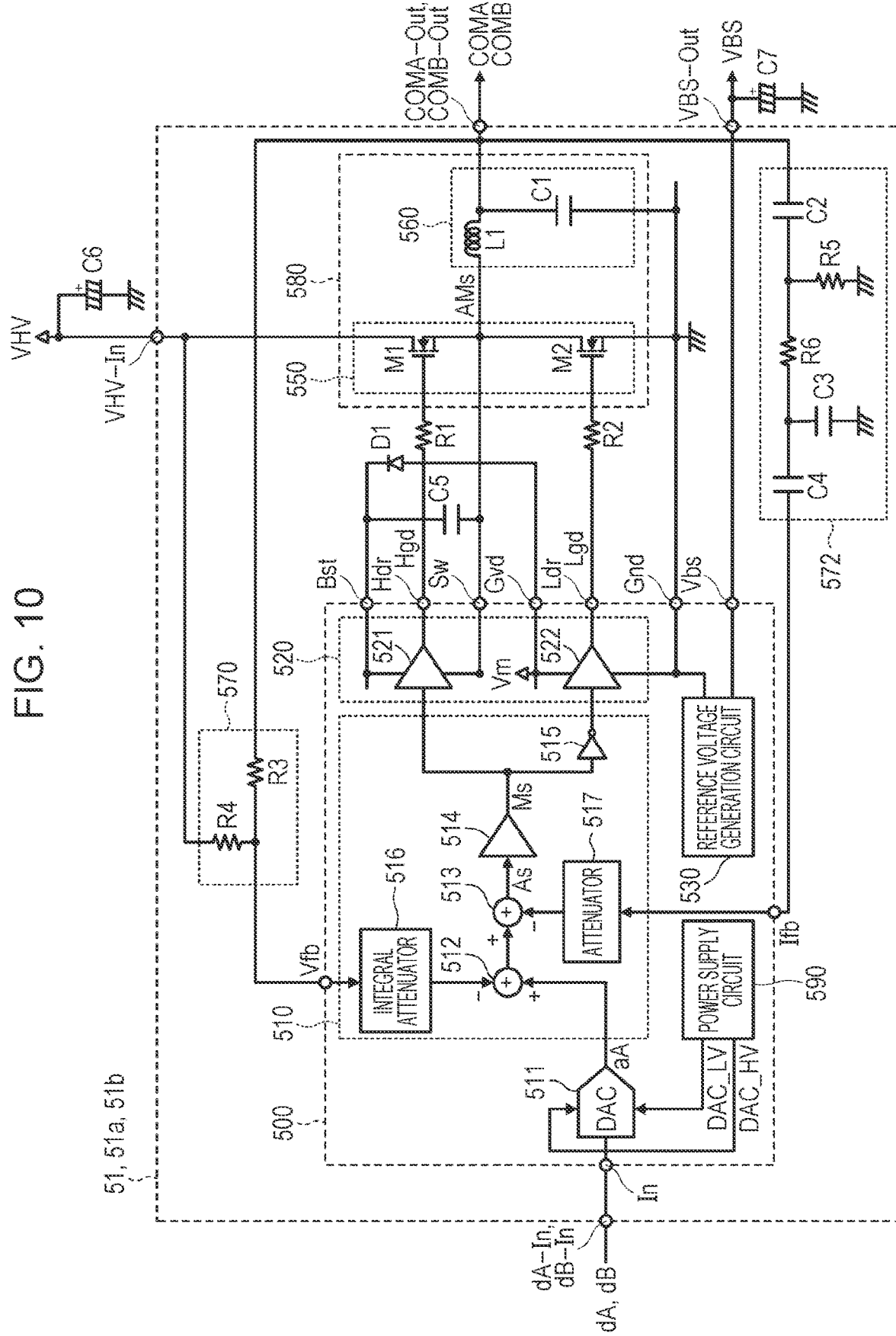
FIG. 10 is a diagram illustrating a circuit configuration of a drive signal output circuit.

Next, the configuration and operation of the drive signal output circuits 51a and 51b that output the drive signals COMA and COMB will be described. Here, the drive signal output circuit 51a and the drive signal output circuit 51b have the same configuration except that only the input signal and the output signal are different. Therefore, in the following description, only the configuration and operation of the drive signal output circuit 51a will be described, and the description of the configuration and operation of the drive signal output circuit 51b will be omitted. In FIG. 10, in addition to the base drive signal dA input to the drive signal output circuit 51a, a terminal dA-In through which the base drive signal dA is input, the drive signal COMA output from the drive signal output circuit 51a, and a terminal COMA-Out through which the drive signal COMA is output, the base drive signal dB input to the drive signal output circuit 51b, a terminal dB-In through which the base drive signal dB is input, the drive signal COMB output from the drive signal output circuit 51b, and a terminal COMB-Out through which the drive signal COMB is output are shown.

FIG. 10 is a diagram illustrating a circuit configuration of the drive signal output circuit 51a. The drive circuit 50 includes a modulation circuit 510 that modulates the base drive signal dA in the drive signal output circuit 51a to output a modulation signal Ms, an amplifier circuit 550 that amplifies the modulation signal Ms to output an amplified modulation signal AMs, and a smoothing circuit 560 that demodulates the amplified modulation signal AMs to output the drive signal COMA. Specifically, as shown in FIG. 10, the drive signal output circuit 51a includes an integrated circuit 500 including a modulation circuit 510, an output circuit 580 including an amplifier circuit 550 and the smoothing circuit 560, a first feedback circuit 570, and a second feedback circuit 572.

The integrated circuit 500 has a plurality of terminals including a terminal In, a terminal Bst, a terminal Hdr, a terminal Sw, a terminal Gvd, a terminal Ldr, a terminal Gnd, and a terminal Vbs. The integrated circuit 500 is electrically coupled to the outside of the integrated circuit 500 via the plurality of terminals.

As shown in FIG. 10, the integrated circuit 500 includes a digital to analog converter (DAC) 511, a modulation circuit 510, a gate drive circuit 520, a reference voltage generation circuit 530, and a power supply circuit 590.

The power supply circuit 590 generates a first voltage signal DAC_HV and a second voltage signal DAC_LV to supply them to the DAC 511.

The DAC 511 converts the digital base drive signal dA that defines the waveform of the drive signal COMA input via the terminal dA-In into a base drive signal aA that is an analog signal having a voltage value between the first voltage signal DAC_HV and the second voltage signal DAC_LV to output the converted base drive signal aA to the modulation circuit 510. Here, the maximum value of the voltage amplitude of the base drive signal aA is defined by the first voltage signal DAC_HV, and the minimum value is defined by the second voltage signal DAC_LV. That is, the first voltage signal DAC_HV is a reference voltage of the DAC 511 on the high voltage side, and the second voltage signal DAC_LV is a reference voltage of the DAC 511 on the low voltage side. A signal obtained by amplifying the analog base drive signal aA is the drive signal COMA. That is, the base drive signal aA corresponds to a target signal before the amplification of the drive signal COMA. The voltage amplitude of the base drive signal aA in the present embodiment is, for example, 1 V to 2 V.

The modulation circuit 510 generates the modulation signal Ms obtained by modulating the base drive signal aA to output the generated modulation signal Ms to the amplifier circuit 550 included in the output circuit 580 via the gate drive circuit 520. Modulation circuit 510 includes adders 512 and 513, a comparator 514, an inverter 515, an integral attenuator 516, and an attenuator 517.

The integral attenuator 516 attenuates and integrates the voltage of the terminal COMA-Out input via a terminal Vfb, that is, the drive signal COMA, and supplies the attenuated and integrated signal to a negative input end of the adder 512. The base drive signal aA is input to a positive input end of the adder 512. The adder 512 supplies a voltage obtained by subtracting and integrating the voltage input to the negative input end from the voltage input to the positive input end to the positive input end of the adder 513.

Here, the maximum value of the voltage amplitude of the base drive signal aA is about 2 V as described above, whereas the maximum value of the voltage of the drive signal COMA may exceed 40 V in some cases. For this reason, the integral attenuator 516 attenuates the voltage of the drive signal COMA input via the terminal Vfb in order to match the amplitude ranges of both voltages when obtaining the deviation.

The attenuator 517 supplies a voltage obtained by attenuating the high-frequency component of the drive signal COMA input via a terminal Ifb to the negative input end of the adder 513. Further, the voltage output from the adder 512 is input to the positive input end of the adder 513. The adder 513 outputs to the comparator 514 a voltage signal As obtained by subtracting the voltage input to the negative input end from the voltage input to the positive input end.

The voltage signal As output from the adder 513 is a voltage obtained by subtracting the voltage of the signal supplied to the terminal Vfb and further subtracting the voltage of the signal supplied to the terminal Ifb from the voltage of the base drive signal aA. For this reason, the voltage of the voltage signal As output from the adder 513 is a signal obtained by correcting the deviation obtained by subtracting the attenuation voltage of the drive signal COMA from the voltage of the base drive signal aA as the target signal by the high-frequency component of the drive signal COMA.

The comparator 514 outputs the pulse-modulated modulation signal Ms based on the voltage signal As output from the adder 513. Specifically, the comparator 514 outputs the modulation signal Ms which is at H level when the voltage signal As output from the adder 513 is equal to or higher than a threshold Vth1 described later in a case where the voltage is rising, and is at L level when the voltage signal As falls below a threshold Vth2 described later in a case where the voltage is dropping. Here, the thresholds Vth1 and Vth2 are set in a relationship in which the threshold Vth1 is greater than the threshold Vth2. The frequency and the duty ratio of the modulation signal Ms change in accordance with the base drive signals dA and aA. Therefore, the attenuator 517 adjusts the modulation gain corresponding to the sensitivity, so that the change amount of the frequency or the duty ratio of the modulation signal Ms can be adjusted.

The modulation signal Ms output from the comparator 514 is supplied to a gate driver 521 included in the gate drive circuit 520. The modulation signal Ms is also supplied to a gate driver 522 included in the gate drive circuit 520 after the logic level is inverted by the inverter 515. That is, the logic levels of the signals supplied to the gate driver 521 and the gate driver 522 are mutually exclusive.

Here, the timing may be controlled so that the logic levels of the signals supplied to the gate driver 521 and the gate driver 522 are not H level at the same time. In other words, "exclusive" here means that the logic levels of the signals supplied to the gate driver 521 and the gate driver 522 are not H level at the same time. For details, this means that a transistor M1 and a transistor M2 included in the amplifier circuit 550 described later are not turned on at the same time.

The gate drive circuit 520 includes the gate driver 521 and the gate driver 522.

The gate driver 521 shifts the level of the modulation signal Ms output from the comparator 514 to output the level-shifted modulation signal Ms as an amplification control signal Hgd from the terminal Hdr. The higher side of the power supply voltage of the gate driver 521 is a voltage applied via the terminal Bst, and the lower side is a voltage applied via the terminal Sw. The terminal Bst is coupled to one end of a capacitor C5 and the cathode of a diode D1 for backflow prevention. The terminal Sw is coupled to the other end of the capacitor C5. The anode of the diode D1 is coupled to the terminal Gvd. As a result, a voltage Vm which is a DC voltage of, for example, 7.5 V supplied from a power supply circuit (not shown) is supplied to the anode of the diode D1. Therefore, the potential difference between the terminal Bst and the terminal Sw is approximately equal to the potential difference between both ends of the capacitor C5, that is, the voltage Vm. The gate driver 521 outputs, from the terminal Hdr, the amplification control signal Hgd having a voltage higher than, by the voltage Vm, that of the terminal Sw according to the input modulation signal Ms.

The gate driver 522 operates at a lower potential than the gate driver 521. The gate driver 522 shifts the level of the signal obtained by inverting, by the inverter 515, the logic level of the modulation signal Ms output from the comparator 514 to output the level-shifted signal as an amplification control signal Lgd from the terminal Ldr. The voltage Vm is applied to the higher side of the power supply voltage of the gate driver 522, and the ground potential of, for example, 0 V is supplied to the lower side via the terminal Gnd. The gate driver 522 outputs, from the terminal Ldr, the amplification control signal Lgd having a voltage higher than, by the voltage Vm, that of the terminal Gnd according to the signal input to the gate driver 522.

Here, the modulation signal is, in a narrow sense, the modulation signal Ms, but assuming that the signal is pulse-modulated according to the analog base drive signal aA based on the digital base drive signal dA, a signal in which the logic level of the modulation signal Ms is inverted is also included in the modulation signal. That is, the modulation signal output from the modulation circuit 510 includes not only the modulation signal Ms input to the gate driver 521, but also a signal in which the logic level of the modulation signal Ms input to the gate driver 522 is inverted, and a signal whose timing is controlled with respect to the modulation signal Ms. The amplification control signal Hgd output by the gate driver 521 is a signal according to the modulation signal Ms, and the amplification control signal Lgd output by the gate driver 522 is a signal according to a signal obtained by inverting the logic level of the modulation signal Ms. Therefore, the modulation signal also includes the amplification control signal Hgd output by the gate driver 521 and the amplification control signal Lgd output by the gate driver 522.

The reference voltage generation circuit 530 generates the reference voltage signal VBS supplied to the electrode 612 of the piezoelectric element 60 to output the generated reference voltage signal VBS to the electrode 612 of the piezoelectric element 60 via the terminal Vbs of the integrated circuit 500 and a terminal VBS-Out of the drive signal output circuit 51a. The reference voltage generation circuit 530 is configured by a constant voltage circuit including a band gap reference circuit, for example.

Here, in FIG. 10, the reference voltage generation circuit 530 is described as being included in the integrated circuit 500 included in the drive signal output circuit 51a, but the reference voltage generation circuit 530 may be configured outside the integrated circuit 500, or may be configured outside the drive signal output circuit 51a.

The output circuit 580 includes the amplifier circuit 550 and the smoothing circuit 560. The amplifier circuit 550 includes the transistor M1 and the transistor M2. The drain of the transistor M1 is electrically coupled to a terminal Hd. The voltage VHV is supplied to the drain of the transistor M1 via a terminal VHV–In. The gate of the transistor M1 is electrically coupled to one end of a resistor R1, and the other end of the resistor R1 is electrically coupled to the terminal Hdr of the integrated circuit 500. That is, the amplification control signal Hgd output from the terminal Hdr of the integrated circuit 500 is supplied to the gate of the transistor M1. The source of the transistor M1 is electrically coupled to the terminal Sw of the integrated circuit 500.

The drain of the transistor M2 is electrically coupled to the terminal Sw of the integrated circuit 500. That is, the drain of the transistor M2 and the source of the transistor M1 are electrically coupled to each other. The gate of the transistor M2 is electrically coupled to one end of a resistor R2, and the other end of the resistor R2 is electrically coupled to the terminal Ldr of the integrated circuit 500. That is, the amplification control signal Lgd output from the terminal Ldr of the integrated circuit 500 is supplied to the gate of the transistor M2. The ground potential is supplied to the source of the transistor M2.

In the amplifier circuit 550 configured as described above, when the transistor M1 is turned off and the transistor M2 is turned on, the voltage of the node to which the terminal Sw is coupled is the ground potential. Therefore, the voltage Vm is supplied to the terminal Bst. On the other hand, when the transistor M1 is turned on and the transistor M2 is turned off, the voltage of the node to which the terminal Sw is coupled is the voltage VHV. Therefore, a voltage signal of the potential of the voltage VHV+Vm is supplied to the terminal Bst.

That is, the gate driver 521 that drives the transistor M1 uses the capacitor C5 as a floating power supply, and when the potential of the terminal Sw changes to 0 V or the voltage VHV according to the operation of the transistor M1 and the transistor M2, supplies, to the gate of the transistor M1, the amplification control signal Hgd whose L level is the potential of the voltage VHV and whose H level is the potential of the voltage VHV+the voltage Vm.

On the other hand, the gate driver 522 that drives the transistor M2 supplies, to the gate of the transistor M2, the amplification control signal Lgd whose L level is the ground potential and whose H level is the potential of the voltage Vm irrespective of the operations of the transistor M1 and the transistor M2.

As described above, the amplifier circuit 550 amplifies, by the transistor M1 and the transistor M2, based on the voltage VHV, the modulation signal Ms obtained by modulating the base drive signals dA and aA. As a result, the amplified modulation signal AMs is generated at the coupling point where the source of the transistor M1 and the drain of the transistor M2 are commonly coupled. Then, the amplified modulation signal AMs generated by the amplifier circuit 550 is input to the smoothing circuit 560.

The smoothing circuit 560 generates the drive signal COMA by smoothing the amplified modulation signal output from the amplifier circuit 550 to output the generated drive signal COMA from the drive signal output circuit 51a. The smoothing circuit 560 includes a coil L1 and a capacitor C1.

The amplified modulation signal AMs output from the amplifier circuit 550 is input to one end of the coil L1. The other end of the coil L1 is coupled to the terminal COMA-Out serving as an output of the drive signal output circuit 51a. That is, the drive signal output circuit 51a is coupled to each of the selection circuits 230 included in the respective print heads 20 via the terminal COMA-Out. As a result, the drive signal COMA output from the drive signal output circuit 51a is supplied to the selection circuit 230. The other end of the coil L1 is also coupled to one end of the capacitor C1. The ground potential is supplied to the other end of the capacitor C1. That is, the coil L1 and the capacitor C1 demodulates the amplified modulation signal AMs output from the amplifier circuit 550 by smoothing it to output the demodulated signal as the drive signal COMA. Here, the smoothing circuit 560 which demodulates the amplified modulation signal AMs by smoothing it to output the demodulated signal as the drive signal COMA is an example of a demodulation circuit.

The first feedback circuit 570 includes a resistor R3 and a resistor R4. One end of the resistor R3 is coupled to the terminal COMA-Out through which the drive signal COMA is output, and the other end is coupled to the terminal Vfb and one end of the resistor R4. The voltage VHV is supplied to the other end of the resistor R4 via the terminal VHV−In. As a result, the drive signal COMA that has passed through the first feedback circuit 570 from the terminal COMA-Out is fed back to the terminal Vfb in a state of being pulled up by the voltage VHV.

The second feedback circuit 572 includes capacitors C2, C3, and C4 and resistors R5 and R6. One end of the capacitor C2 is coupled to the terminal COMA-Out through which the drive signal COMA is output, and the other end is coupled to one end of the resistor R5 and one end of the resistor R6. The ground potential is supplied to the other end of the resistor R5. Thus, the capacitor C2 and the resistor R5 function as a high pass filter. The cut-off frequency of the high-pass filter is set to, for example, about 9 MHz. The other end of the resistor R6 is coupled to one end of the capacitor C4 and one end of the capacitor C3. The ground potential is supplied to the other end of the capacitor C3. Thus, the resistor R6 and the capacitor C3 function as a low-pass filter. The cutoff frequency of the LPF is set to, for example, about 160 MHz. In this way, since the second feedback circuit 572 includes the high-pass filter and the low-pass filter, so that the second feedback circuit 572 functions as a band pass filter that passes a predetermined frequency range of the drive signal COMA.

The other end of the capacitor C4 is coupled to the terminal Ifb of the integrated circuit 500. As a result, a Signal obtained by cutting the DC component out of the high frequency components of the drive signal COMA that has passed through the second feedback circuit 572 that functions as the band pass filter is fed back to the terminal Ifb.

The drive signal COMA output from the terminal COMA-Out is a signal obtained by smoothing the amplified modulation signal AMs by the smoothing circuit 560. The drive signal COMA is integrated/subtracted via the terminal Vfb, and then fed back to the adder 512. Therefore, the drive signal output circuit 51a self-oscillates at a frequency determined by the feedback delay and the feedback transfer function.

However, since the feedback path via the terminal Vfb has a large delay amount, so that there is a case where the frequency of the self-oscillation cannot be made high enough to ensure the accuracy of the drive signal COMA simply by the feedback via the terminal Vfb. Therefore, the delay in the entire circuit is reduced by providing a path through which the high-frequency component of the drive signal COMA is fed back via the terminal Ifb separately from the path via the terminal Vfb. As a result, the frequency of the voltage signal As can be made high enough to ensure the accuracy of the drive signal COMA as compared with the case where there is no path via the terminal Ifb.

Figure 11:
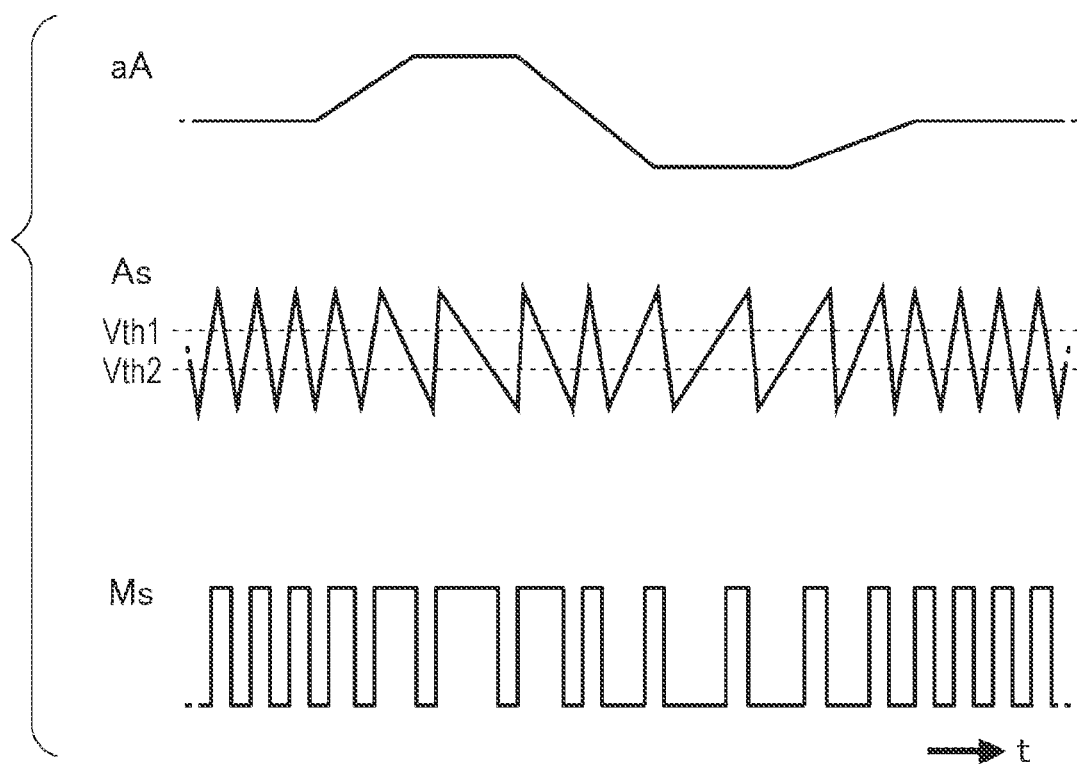
FIG. 11 is a diagram illustrating the waveforms of a voltage signal As and a modulation signal Ms in association with the waveform of an analog base drive signal aA.

FIG. 11 is a diagram illustrating the waveforms of the voltage signal As and the modulation signal Ms in association with the waveform of the analog base drive signal aA. As shown in FIG. 11, the voltage signal As is a triangular wave, and its oscillation frequency varies according to the voltage of the base drive signal aA. Specifically, the frequency is highest when the voltage has an intermediate value, and decreases as the voltage has a higher value or a lower value than the intermediate value.

Further, the slope of the triangular wave of the voltage signal As at the rise of the voltage is almost equal to that at the fall of the voltage when the voltage has the nearly intermediate value. Therefore, the duty ratio of the modulation signal Ms obtained by comparing the voltage signal As with the thresholds Vth1 and Vth2 of the comparator 514 is approximately 50%. When the voltage of the voltage signal As increases from the intermediate value, the downward slope of the voltage signal As is gentle. Therefore, the period during which the modulation signal Ms is at H level is relatively long, and the duty ratio of the modulation signal Ms increases. On the other hand, when the voltage of the voltage signal As decreases from the intermediate value, the upward slope of the voltage signal As decreases. Therefore, the period during which the modulation signal Ms is at H level is relatively short, and the duty ratio of the modulation signal Ms decreases.

The gate driver 521 turns on or off the transistor M1 based on the modulation signal Ms. That is, the gate driver 521 turns on the transistor M1 when the modulation signal Ms is at H level, and turns off the transistor M1 when the modulation signal Ms is at L level. The gate driver 522 turns on or off the transistor M2 based on the logically inverted signal of the modulation signal Ms. That is, the gate driver 522 turns off the transistor M2 when the modulation signal Ms is at H level and turns on the transistor M2 when the modulation signal Ms is at L level.

Therefore, the voltage value of the drive signal COMA obtained by smoothing the amplified modulation signal AMs output from the amplifier circuit 550 by the smoothing circuit 560 increases as the duty ratio of the modulation signal Ms increases, and decreases as the duty ratio decreases. That is, the control is performed so that the waveform of the drive signal COMA matches the waveform obtained by enlarging the voltage of the base drive signal aA obtained by performing the analog conversion on the digital base drive signal dA.

Further, since the drive signal output circuit 51a uses the pulse density modulation, there is also an advantage that the change width of the duty ratio can be made large as compared with that of the pulse width modulation with a fixed modulation frequency. The minimum positive pulse width and the minimum negative pulse width that can be used in the drive signal output circuit 51a are limited by circuit characteristics. Therefore, in the pulse width modulation in which the frequency is fixed, the change width of the duty ratio is limited within a predetermined range. In contrast, with the pulse density modulation, as the voltage of the voltage signal As moves away from the intermediate value, the oscillation frequency decreases, and as a result, it is possible to further increase the duty ratio in a region where the voltage is high. Further, it is possible to further decrease the duty ratio in a region where the voltage is low. Therefore, it is possible to secure a wider range of the change width of the duty ratio by employing self-oscillation type pulse density modulation.

Here, the drive signal COMA output by the drive signal output circuit 51a is selected or deselected by the selection circuit 230 to be supplied, as the drive signal VOUT supplied to the electrode 611 of the piezoelectric element 60, to the piezoelectric element 60. That is, the output current based on the drive signal COMA output by the drive signal output circuit 51a changes according to the number of the piezoelectric elements 60 supplied as the drive signal VOUT. Then, the output current of the drive signal output circuit 51a changes, so that the voltage value of the voltage VHV input to the drive signal output circuit 51a may fluctuate. As a result, the waveform accuracy of the drive signal COMA generated by amplification based on the voltage VHV may decrease.

Therefore, as shown in FIG. 10, a capacitor C6 for reducing the voltage fluctuation of the voltage VHV when the output current of the drive signal output circuit 51a changes is electrically coupled to the terminal VHV-In. The capacitor C6 is required to have a relatively large capacitance for reducing the voltage fluctuation of the voltage VHV with respect to the change in the output current, and to have a withstand voltage equal to or higher than the voltage value of the voltage VHV. Therefore, an electrolytic capacitor having a relatively large capacitance and a withstand voltage of several tens of volts or more is used for the capacitor C6. As a result, it is possible to reduce the possibility that the voltage value of the voltage VHV fluctuates in response to the change in the output current of the drive signal output circuit 51a.

Further, the reference voltage generation circuit 530 included in the integrated circuit 500 generates the reference voltage signal VBS supplied to the electrode 612 of the piezoelectric element 60 to output the generated reference voltage signal VBS via the terminal VBS-Out. The current value output from the drive signal output circuit 51a based on the reference voltage signal VBS changes according to the number of piezoelectric elements 60 to which the drive signal COMA as the drive signal VOUT is supplied. Therefore, the voltage value of the reference voltage signal VBS may fluctuate, and when the voltage value of the reference voltage signal VBS fluctuates, the potential difference between the electrode 611 and the electrode 612 of the piezoelectric element 60 may vary. Therefore, the driving of the piezoelectric element 60 may vary, and as a result, the ejection accuracy of the ink may decrease.

For this reason, as shown in FIG. 10, a capacitor C7 for reducing the voltage fluctuation of the reference voltage signal VBS when the current value output from the drive signal output circuit 51a based on the reference voltage signal VBS changes is electrically coupled to the terminal VBS-Out. The capacitor C7 is required to have a relatively large capacitance for reducing the voltage fluctuation of the reference voltage signal VBS with respect to the change in the output current, and to have a withstand voltage equal to or higher than the voltage value of the reference voltage signal VBS. Therefore, an electrolytic capacitor having a relatively large capacitance and a withstand voltage of several volts or more is used for the capacitor C7. As a result, it is possible to reduce the possibility that the voltage value of the reference voltage signal VBS fluctuates with respect to the change in the current value output from the drive signal output circuit 51a based on the reference voltage signal VBS.

1.6 Configuration of Circuit Substrate Provided with Drive Circuit and Drive Signal Output Circuit Next, the configuration of a drive signal output circuit substrate 40a on which the drive signal output circuit 51a is mounted, a drive signal output circuit substrate 40b on which the drive signal output circuit 51b is mounted, and a drive circuit substrate 30 to which the drive signal output circuit substrates 40a and 40b are detachably coupled will be described.

That is, the drive circuit 50 includes drive signal output circuit substrates 40a and 40b and the drive circuit substrate 30. In the following explanation, the capacitor C6 electrically coupled to the terminal VHV-In of the drive signal output circuit 51a may be referred to as a capacitor C6a, and the capacitor C7 electrically coupled to the terminal VBS-Out of the drive signal output circuit 51a may be referred to as a capacitor C7a. Similarly, the capacitor C6 electrically coupled to the terminal VHV-In of the drive signal output circuit 51b is referred to as a capacitor C6b, the capacitor C7 electrically coupled to the terminal VBS-Out of the drive signal output circuit 51b may be referred to as a capacitor C7b.

Figure 12:
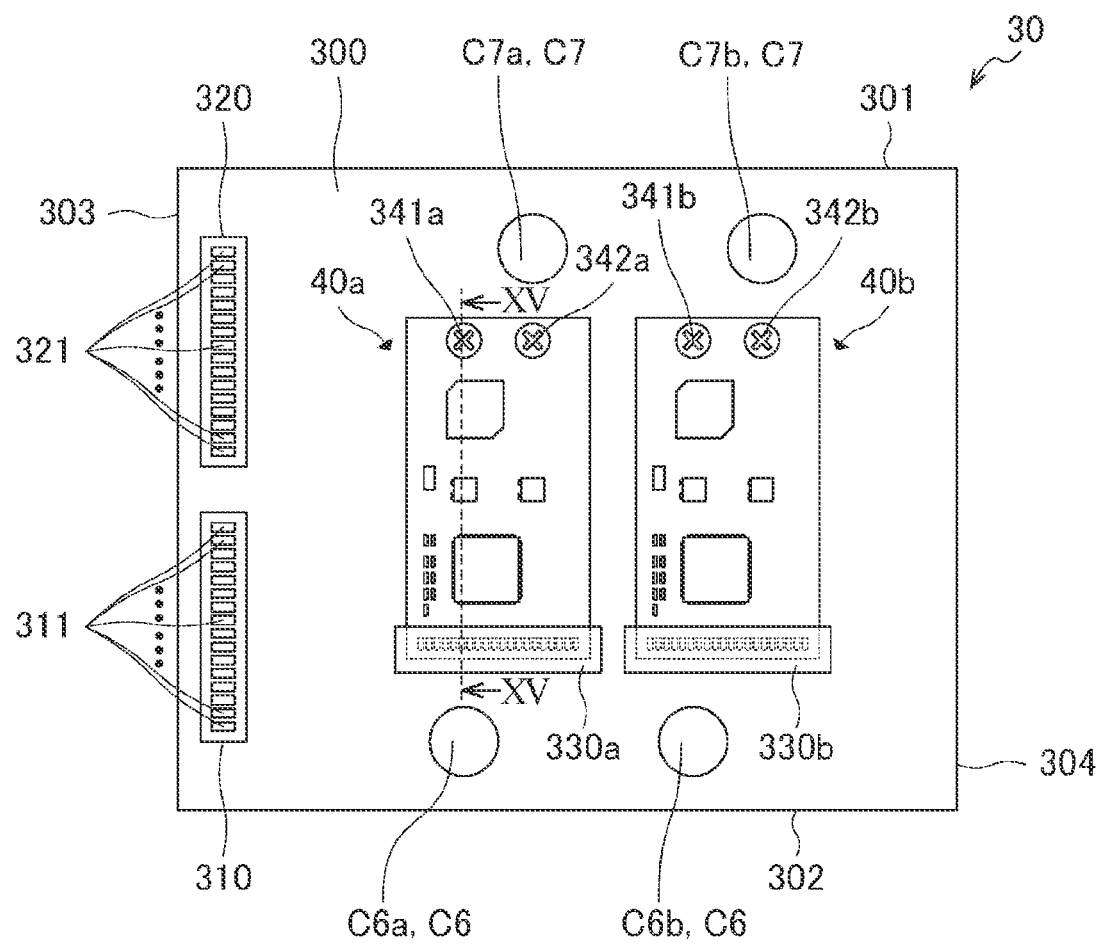
FIG. 12 is a plan view illustrating a configuration of a drive circuit substrate.

FIG. 12 is a plan view illustrating the configuration of the drive circuit substrate 30. As shown in FIG. 12, the drive circuit substrate 30 includes a wiring substrate 300, connectors 310, 320, 330a and 330b, and the capacitors C6a, C6b, C7a, and C7b.

The wiring substrate 300 has a substantially rectangular shape including a side 301, a side 302 facing the side 301, a side 303 intersecting the side 301 and the side 302, and a side 304 facing the side 303 and intersecting the side 301 and the side 302. The wiring substrate 300 is provided with the connectors 310, 320, 330a and 330b and the capacitors C6a, C6b, C7a, and C7b. Further, the drive signal output circuit substrates 40a and 40b are detachably coupled to the wiring substrate 300.

The connector 310 includes a plurality of terminals 311 disposed side by side in the direction along the side 303. Various signals including the clock signal SCK, the print data signal SI, the latch signal LAT, the change signal CH, and the base drive signals dA and dB which are output by the control circuit 100 described above, and various voltage signals including the voltage VHV output by the voltage output circuit 110 are input to the connector 310. Of the clock signal SCK, the print data signal SI, the latch signal LAT, the change signal CH, the base drive signals dA and dB, and the voltage VHV which are input to the connector 310, the base drive signal dA and the voltage VHV are supplied to the drive signal output circuit substrates 40a, and the base drive signal dB and the voltage VHV are supplied to the drive signal output circuit substrate 40b. The clock signal SCK, the print data signal SI, the latch signal LAT, and the change signal CH in addition to the base drive signals dA and dB, and the voltage VHV may be input to the drive signal output circuit substrates 40*a* and 40*b*.

The connector 320 is located toward the side 301 relative to the connector 310 and includes a plurality of terminals 321 disposed side by side in the direction along the side 303. The drive signal COMA output from the drive signal output circuit 51*a* mounted on the drive signal output circuit substrate 40*a*, the drive signal COMB output from the drive signal output circuit 51*b* mounted on the drive signal output circuit substrate 40*b*, and the reference voltage signal VBS are input to the connector 320. Further, the clock signal SCK, the print data signal SI, the latch signal LAT, and the change signal CH are input to the connector 320. Various signals including the drive signals COMA and COMB, the reference voltage signal VBS, the clock signal SCK, the print data signal SI, the latch signal LAT, and the change signal CH which are input to the connector 320 are supplied to the print head 20.

The capacitor C6*a* is provided toward the side 304 relative to the connector 310. The capacitor C6*b* is provided toward the side 304 relative to the capacitor C6*a*. That is, the capacitors C6*a* and C6*b* are located toward the side 304 relative to the connector 310, and are provided side by side in the order of the capacitor C6*a* and the capacitor C6*b* in the direction from the side 303 to the side 304.

The capacitor C7*a* is provided toward the side 304 relative to the connector 320 and toward the side 301 relative to the capacitors C6*a* and C6*b*. The capacitor C7*b* is provided toward the side 304 relative to the capacitor C7*a* and toward the side 301 relative to the capacitors C6*a* and C6*b*. That is, the capacitors C7*a* and C7*b* are located toward the side 304 relative to the connector 320 and toward the side 301 relative to the capacitors C6*a* and C6*b*, and are disposed side by side in the order of the capacitor C7*a* and the capacitor C7*b* in the direction from the side 303 to the side 304.

The connector 330*a* is located toward the side 304 relative to the connector 310, and is provided between the capacitors C6*a* and C6*b* and the capacitors C7*a* and C7*b*. The connector 330*b* is located toward the side 304 relative to the connector 330*a* and is provided between the capacitors C6*a* and C6*b* and the capacitors C7*a* and C7*b*. That is, the connectors 330*a* and 330*b* are toward the side 304 relative to the connector 310, toward the side 301 relative to the capacitors C6*a* and C6*b*, and toward the side 302 relative to the capacitors C7*a* and C7*b*, and are provided side by side in the order of the connector 330*a* and the connector 330*b* in the direction from the side 303 to the side 304.

The drive signal output circuit substrate 40*a* is detachably coupled to the wiring substrate 300 toward the side 301 relative to the connector 330*a*. Specifically, one side of the drive signal output circuit substrate 40*a* is inserted into the connector 330*a*, and screws 341*a* and 342*a* coupled to the wiring substrate 300 are attached toward the other side of the drive signal output circuit substrate 40*a*, so that the drive signal output circuit substrate 40*a* is detachably coupled to the wiring substrate 300. Similarly, the drive signal output circuit substrate 40*b* is detachably coupled to the wiring substrate 300 toward the side 301 relative to the connector 330*b*. Specifically, one side of the drive signal output circuit substrate 40*b* is inserted into the connector 330*b*, and screws 341*b* and 342*b* coupled to the wiring substrate 300 are attached toward the other side of the drive signal output circuit substrate 40*b*, so that the drive signal output circuit substrate 40*b* is detachably coupled to the wiring substrate 300.

Here, the connector 330*a* may be configured by a card edge connector or the like electrically coupled to the drive signal output circuit substrate 40*a* by an insertion of one side of the drive signal output circuit substrate 40*a* into the connector 330*a*, and similarly, the connector 330*b* may be configured by a card edge connector or the like electrically coupled to the drive signal output circuit substrate 40*b* by an insertion of one side of the drive signal output circuit substrate 40*b* into the connector 330*b*.

Figure 13:
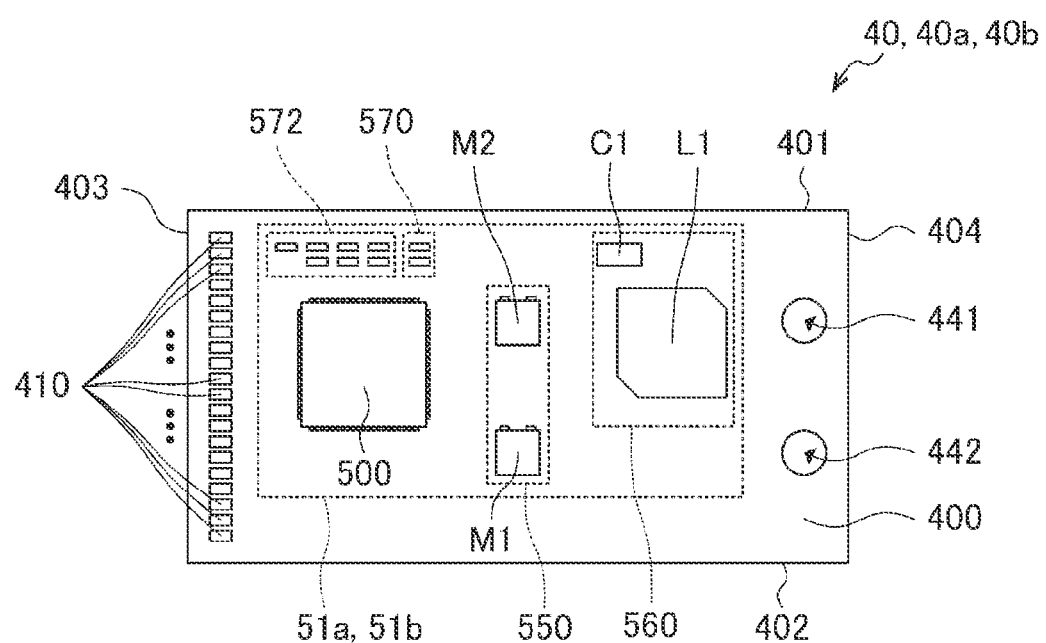
FIG. 13 is a plan view illustrating a configuration of a drive signal output circuit substrate.

Next, details of the configuration of the drive signal output circuit substrates 40*a* and 40*b* detachably coupled to the wiring substrate 300 will be described with reference to FIG. 13. FIG. 13 is a plan view illustrating the configuration of the drive signal output circuit substrates 40*a* and 40*b*. It should be noted that the drive signal output circuit substrate 40*a* and the drive signal output circuit substrate 40*b* have the same configuration except that the circuit to be mounted is the drive signal output circuit 51*a* or the drive signal output circuit 51*b*. Therefore, in FIG. 13, the configuration of the drive signal output circuit substrate 40*a* will be described as an example, and the description of the drive signal output circuit substrate 40*b* will be simplified or omitted.

As shown in FIG. 13, the drive signal output circuit substrate 40*a* includes the drive signal output circuit 51*a* that outputs the drive signal COMA for driving the piezoelectric element 60, a plurality of terminals 410 to which the base drive signal dA that is the base of the drive signal COMA and the voltage VHV are input, and a wiring substrate 400 on which the drive signal output circuit 51*a* and the plurality of terminals 410 is provided.

The wiring substrate 400 has a substantially rectangular shape including a side 401, a side 402 facing the side 401, a side 403 intersecting the side 401 and the side 402, and a side 404 facing the side 403 and intersecting the side 401 and the side 402. Then, as shown in FIG. 13, the length of the side 401 and the side 402 of the wiring substrate 400 are longer than the length of the side 403 and the side 404. In other words, the wiring substrate 400 includes the side 403 and the side 404, and the side 401 and the side 402 longer than the side 403 and the side 404.

The plurality of terminals 410 is provided on the wiring substrate 400 side by side in the direction along the side 403 of the wiring substrate 400. The plurality of terminals 410 is electrically coupled to the connector 330*a* included in the drive circuit substrate 30. That is, the plurality of terminals 410 and the connector 330*a* are electrically coupled by inserting the side 403 of the wiring substrate 400 included in the drive signal output circuit substrate 40*a* into the connector 330*a*, so that the drive signal output circuit substrate 40*a* and the drive circuit substrate 30 are electrically coupled. As a result, the base drive signals dA and dB and the voltage VHV are input to the drive signal output circuit substrate 40*a* via the plurality of terminals 410.

The drive signal output circuit 51*a* is positioned on the wiring substrate 400 toward the side 404 relative to the plurality of terminals 410. In other words, at least one of the plurality of terminals 410 and the drive signal output circuit 51 are positioned side by side in the direction along the side 401. Specifically, as described above, the drive signal output circuit 51 includes the integrated circuit 500, the amplifier circuit 550, the smoothing circuit 560, the first feedback circuit 570, and the second feedback circuit 572. The integrated circuit 500 is positioned toward the side 404 relative to the plurality of terminals 410. The amplifier circuit 550 is positioned toward the side 404 relative to the integrated circuit 500. The smoothing circuit 560 is positioned toward the side 404 relative to the amplifier circuit 550. That is, the integrated circuit 500, the amplifier circuit 550, and the smoothing circuit 560 are positioned toward the side 404 relative to the plurality of terminals 410 provided on the wiring substrate 400, and are provided side by side in the order of the integrated circuit 500, the amplifier circuit 550, and the smoothing circuit 560 in the direction from the side 403 to the side 404.

The first feedback circuit 570 is positioned toward the side 401 relative to the integrated circuit 500 and toward the side 404 relative to the plurality of terminals 410. The second feedback circuit 572 is positioned toward the side 404 relative to the first feedback circuit 570 and toward the side 401 relative to the integrated circuit 500.

As mentioned above, the modulation circuit 510, the amplifier circuit 550, and the smoothing circuit 560 included in the drive signal output circuit 51a are provided on the drive signal output circuit substrate 40a, and the modulation circuit 510, the amplifier circuit 550, and the smoothing circuit 560 included in the drive signal output circuit 51b are provided on the drive signal output circuit substrate 40b. Here, at least one of the drive signal output circuit substrate 40a and the drive signal output circuit substrate 40b corresponds to a circuit substrate, and the wiring substrate 400 included in the drive signal output circuit substrate 40a and the drive signal output circuit substrate 40b is an example of a substrate.

Further, the wiring substrate 400 has insertion holes 441 and 442. The insertion holes 441 and 442 are positioned toward the side 404 relative to the drive signal output circuit 51 in the wiring substrate 400, and are provided in the order of the insertion hole 441 and the insertion hole 442 in the direction from the side 401 to the side 402. Then, the screw 341a is inserted into the insertion hole 441, and the screw 342a is inserted into the insertion hole 442. The drive signal output circuit substrate 40a is attached to the drive circuit substrate 30 by tightening the screws 341a and 342a inserted into the insertion holes 441 and 442 to the drive circuit substrate 30.

Next, a specific example of the electrical connection between the drive circuit substrate 30 and the drive signal output circuit substrates 40a and 40b will be described. Before describing the electrical connection between the drive circuit substrate 30 and the drive signal output circuit substrates 40a and 40b, the configuration of the wiring substrate 400 included in the drive signal output circuit substrates 40a and 40b will be described first with reference to FIG. 14.

Figure 14:
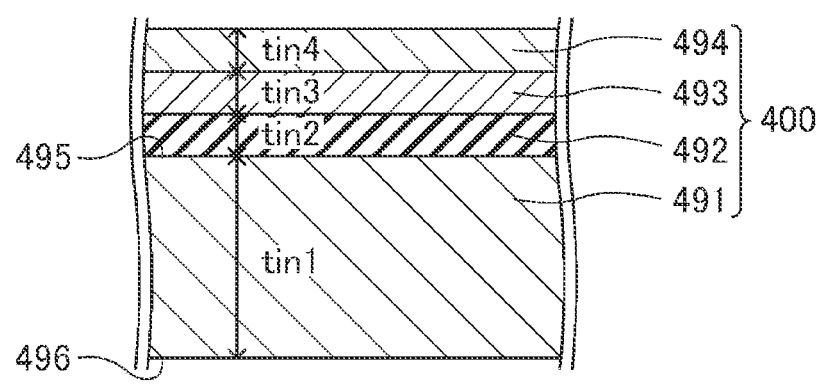
FIG. 14 is a diagram for explaining the configuration of a wiring substrate.

FIG. 14 is a diagram for explaining the configuration of the wiring substrate 400. As shown in FIG. 14, the wiring substrate 400 includes a base material 491, an insulation layer 492, a wiring layer 493, and a protective layer 494.

The base material 491 is a plate-shaped member including a face 495 and a face 496 opposite to the face 495, and bears the strength of the wiring substrate 400. The base material 491 in the present embodiment is configured to include a metal having excellent thermal conductivity. That is, the base material 491 includes a metal. Here, the metal contained in the base material 491 is a material having excellent thermal conductivity among metals, and for example, copper and a copper alloy, aluminum and an aluminum alloy, or the like are preferably used. That is, the base material 491 preferably contains copper as a metal.

The insulation layer 492, the wiring layer 493, and the protective layer 494 are laminated in the order of the insulation layer 492, the wiring layer 493, and the protective layer 494 in the direction along the direction normal to the face 495 of the base material 491. In other words, the wiring substrate 400 includes the base material 491, and the insulation layer 492, the wiring layer 493, and the protective layer 494 that are laminated in the direction normal to the face 495 of the base material 491.

The wiring layer 493 includes a plurality of wires containing copper or a copper alloy. Each wire includes a wire through which the base drive signal dA input to the drive signal output circuit 51a propagates, a wire through which the amplified modulation signal AMs output by the amplifier circuit 550 included in the drive signal output circuit 51a propagates, a wire through which the drive signal COMA output by the drive signal output circuit 51a propagates, a wire through which the ground signal indicating the reference potential of the drive signal output circuit 51a propagates, and the like.

The insulation layer 492 is provided between the base material 491 and the wiring layer 493. This reduces the possibility that a plurality of signals propagating through the wiring layer 493 will be short-circuited by the metal contained in the base material 491. Further, the protective layer 494 reduces the possibility that a short circuit may occur between the wires provided in a wiring layer 393 when the extra solder used when various circuit components included in the drive signal output circuit 51a are mounted on the wiring substrate 400 is attached to the wiring formed in the wiring layer 493.

Here, the thickness tin1 of the base material 491 included in the wiring substrate 400 is thicker than any of the thickness tin2 of the insulation layer 492, the thickness tin3 of the wiring layer 493, and the thickness tin4 of the protective layer 494. That is, the thickness tin1 of the base material 491 is thicker than the thickness tin2 of the insulation layer 492, the thickness tin1 of the base material 491 is thicker than the thickness tin3 of the wiring layer 493, and the thickness tin1 of the base material 491 is thicker than the thickness tin4 of the protective layer 494. Specifically, while the thickness tin1 of the base material 491 is about 0.5 mm to 2.5 mm, the thickness tin2 of the insulation layer 492, the thickness tin3 of the wiring layer 493, and the thickness tin4 of the protective layer 494 are each about 10 μm to 200 μm. In this way, the thickness tin1 of the base material 491 is thicker than any of the thickness tin2 of the insulation layer 492, the thickness tin3 of the wiring layer 493, and the thickness tin4 of the protective layer 494, so that the strength of the wiring substrate 400 can be maintained.

As described above, the wiring substrate 400 in the present embodiment is configured to include the base material 491, and the insulation layer 492, the wiring layer 493, and the protective layer 494 that are laminated on the face 495 of the base material 491. The electronic components included in the amplifier circuit 550 and the smoothing circuit 560 are electrically coupled to the wiring included in the wiring layer 493 laminated on the base material 491, and the amplifier circuit 550 and the smoothing circuit 560 are positioned on the protective layer 494 laminated on the base material 491. That is, the amplifier circuit 550 is positioned so as to overlap at least part of the base material 391 in the direction normal to the base material 491, and the smoothing circuit 560 is positioned so as to overlap at least part of the base material 391 in the direction normal to the base material 491.

Here, the wiring layer 493 including the wiring through which at least one of the amplified modulation signal AMs and the drive signal COMA propagates is an example of a first layer, and the face 495 of the base material 491 on which the wiring layer 493 is laminated is an example of a first face of the base material 491. The face 495 of the base material 491 is an example of a first face.

Figure 15:
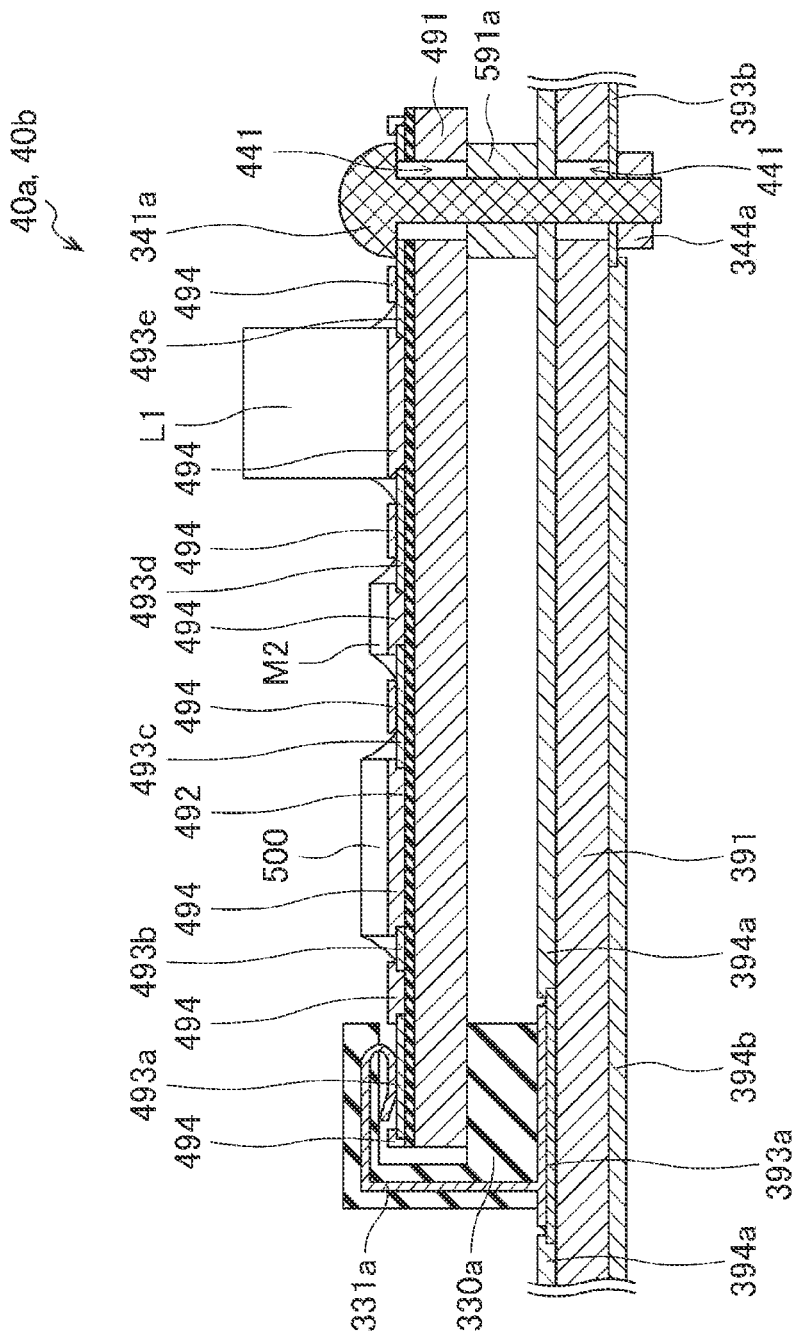
FIG. 15 is a diagram illustrating a cross section of the drive circuit substrate and the drive signal output circuit substrate taken along line XV-XV shown in FIG. 12.

Next, a specific example of the electrical connection between the drive circuit substrate 30 and the drive signal output circuit substrates 40*a* and 40*b* will be described with reference to FIG. 15. FIG. 15 is a diagram illustrating a cross section of the drive circuit substrate 30 and the drive signal output circuit substrate 40*a* taken along line XV-XV shown in FIG. 12.

As shown in FIG. 15, the connector 330*a* includes a conductive portion 331*a*. One end of the conductive portion 331*a* is electrically coupled to a wire 393*a* provided on the wiring substrate 300, the other end of the conductive portion 331*a* is electrically coupled to a wire 493*a* included in the wiring layer 493 of the wiring substrate 400 included in the drive signal output circuit substrate 40*a* inserted into the connector 330*a*. As a result, various signals including the base drive signal dA propagating in the drive circuit substrate 30 and the voltage VHV are input to the wiring layer 493 included in the drive signal output circuit substrate 40*a*. Here, the wire 493*a* electrically coupled to the conductive portion 331*a* included in the connector 330*a* corresponds to the plurality of terminals 410 provided on the wiring substrate 400 described above. That is, the connector 330*a* includes the plurality of conductive portions 331*a* corresponding to the plurality of respective terminals 410 included in the drive signal output circuit substrate 40*a*.

Of the base drive signal dA and the voltage VHV input to the drive signal output circuit substrate 40*a* via the wire 493*a*, the base drive signal dA propagates through a wire 493*b* provided in the wiring layer 493 of the wiring substrate 400, and is input to the integrated circuit 500 including the modulation circuit 510. As described above, the integrated circuit 500 generates and output the amplification control signals Hgd and Lgd based on the input base drive signal dA.

Of the amplification control signals Hgd and Lgd output from the integrated circuit 500, the amplification control signal Lgd propagates through a wire 493*c* and is input to the transistor M2 included in the amplifier circuit 550. Further, the amplification control signal Hgd propagates through a wire (not shown) provided in the wiring layer 493 and is input to the transistor M1 included in the amplifier circuit 550.

The amplifier circuit 550 operates, based on the voltage VHV, the amplification control signals Hgd and Lgd input to the transistors M1 and M2. As a result, the amplified modulation signal AMs is generated and output to a wire 493*d*.

The amplified modulation signal AMs output from the amplifier circuit 550 propagates through the wire 493*d* and is input to one end of the coil L1 included in the smoothing circuit 560. The smoothing circuit 560 generates the drive signal COMA by demodulating the amplified modulation signal AMs by the coil L1 and the capacitor C1 (not shown) to output the generated drive signal COMA to a wire 493*e*.

The wire 493*e* is electrically coupled to the screw 341*a* inserted through the insertion hole 441. The screw 341*a* is inserted through a spacer 591*a* and an insertion hole 345*a* provided in the wiring substrate 300, and is tightened by a nut 344*a*. As a result, the drive signal output circuit substrate 40*a* is fixed to the drive circuit substrate 30. Further, the screw 341*a* is tightened by the nut 344*a*, so that the nut 344*a* is electrically coupled to a wire 393*b* provided on the wiring substrate 300. Then, the wire 393*b* is electrically coupled to the connector 320 shown in FIG. 12.

As a result, the drive signal COMA output from the smoothing circuit 560 is input to the connector 320 via the wire 493*e*, the screw 341*a*, the nut 344*a*, and the wire 393*b*. Then, the drive signal COMA input to the connector 320 is supplied to the print head 20.

Here, among the plurality of wires included in the wiring layer 493 of the wiring substrate 400, at least one of the wire 493*d* through which the amplified modulation signal AMs propagates and the wire 493*e* through which the drive signal COMA propagates is an example of a first propagation wire.

The drive circuit substrate 30 is electrically coupled to the wiring substrate 400 included in the drive signal output circuit substrate 40*a*, relays the reference voltage signal VBS, the clock signal SCK, the print data signal SI, the latch signal LAT, and the change signal CH that are input from the connector 310 to the connector 320, relays the base drive signal dA to the drive signal output circuit substrate 40*a*, and further, relays the drive signal COMA output from the drive signal output circuit substrate 40*a* to the connector 320. That is, the drive circuit substrate 30 that is electrically coupled to the wiring substrate 400 and that relays the propagation of the drive signal COMA to the print head 20 is an example of a relay circuit substrate.

1.7 Functions and Effects

In the liquid ejecting apparatus 1 and the drive signal output circuit substrates 40*a* and 40*b* of the first embodiment configured as described above, of the drive circuit 50 that outputs drive signals COMA and COMB that drive the piezoelectric element 60, the wiring substrate 400 on which the modulation circuit 510, the amplifier circuit 550, and the smoothing circuit 560 that are included in the drive signal output circuit 51*a* are provided includes the base material 491 containing a metal, and the wiring layer 493 provided with at least one of the wire 493*d* through which the amplified modulation signal AMs propagates and the wire 493*e* through which the drive signal COMA propagates both of which are laminated on the base material 491. In the liquid ejecting apparatus 1 and the drive signal output circuit substrates 40*a* and 40*b* configured as described above, heat generated by the amplified modulation signal AMs having a large amount of current propagating through the wiring provided in the wiring layer 393 and the drive signal COMA is conducted to the base material 491. In this case, since the base material 491 includes a metal having excellent thermal conductivity, and is thicker than the wiring layer 493, the heat generated by the amplified modulation signal AMs having a large amount of current propagating through the wiring provided in the wiring layer 393 and the drive signal COMA is efficiently dispersed and released by the base material 491. That is, the heat generated in the drive circuit 50 can be efficiently released.

Further, since the base material 491 contains a metal having excellent thermal conductivity, and is thicker than the wiring layer 493, the possibility that heat generated by the amplified modulation signal AMs having a large amount of current propagating through the wiring provided in the wiring layer 393 and the drive signal COMA may be locally concentrated near the heat-generating components and the wiring is reduced, and as a result, the possibility that the characteristic deterioration of the components consisting of the drive circuit 50, and malfunction of the drive circuit 50 due to the characteristic deterioration may occur is reduced.

As described above, the effect of efficiently releasing the heat generated in the drive circuit 50, and the effect of reducing the possibility that deterioration of the characteristics of the components constituting the drive circuit 50, and malfunction of the drive circuit 50 due to the characteristic deterioration, and the like may occur are more prominent when the metal constituting the base material 491 contains copper having excellent thermal conductivity.

1.8 Modification

In the liquid ejecting apparatus 1 and the drive signal output circuit substrates 40a and 40b of the first embodiment described above, a ground signal indicating the reference potential of the drive circuit 50 and the drive signal output circuits 51a and 51b may be supplied to the base material 491 included in the wiring substrate 400. As described above, the thickness tin1 of the base material 491 is thicker than the thickness tin3 of the wiring layer 393. Therefore, the resistivity of the base material 491 made of metal is smaller than the resistivity of the wiring layer 393. The ground signal indicating the reference potential of the drive circuit 50 and the drive signal output circuits 51a and 51b is supplied to the base material 491 having such a small resistivity, so that the operations of the drive circuit 50 and the drive signal output circuits 51a and 51b can be further stabilized.

In the liquid ejecting apparatus 1 and the drive signal output circuit substrates 40a and 40b according to the first embodiment described above, the description is made in which the drive signal output circuit 51a is mounted on the wiring substrate 400 included in the drive signal output circuit substrate 40a, and the drive signal output circuit 51b is mounted on the wiring substrate 400 included in the drive signal output circuit substrate 40b, but the drive signal output circuit 51a and the drive signal output circuit 51b may be mounted on a common wiring substrate. Even in this case, the same functions and effects as those of the liquid ejecting apparatus 1 and the drive signal output circuit substrates 40a and 40b of the first embodiment can be obtained.

Further, the drive signal output circuit 51a and the drive signal output circuit 51b may be a common wiring substrate and may be mounted on the drive circuit substrate 30. In this case, when the base material of the wiring substrate 300 is configured to include a metal, it is possible to achieve the same functions and effects as the liquid ejecting apparatus 1 and the drive signal output circuit substrates 40a and 40b of the first embodiment.

2. Second Embodiment

The liquid ejecting apparatus 1 and the drive signal output circuit substrates 40a and 40b in the second embodiment are different from the liquid ejecting apparatus 1 and the drive signal output circuit substrates 40a and 40b of the first embodiment in that an insulation layer, a wiring layer, and a protective layer is laminated on both faces of the base material 491 of the wiring substrate 400.

Figure 16:
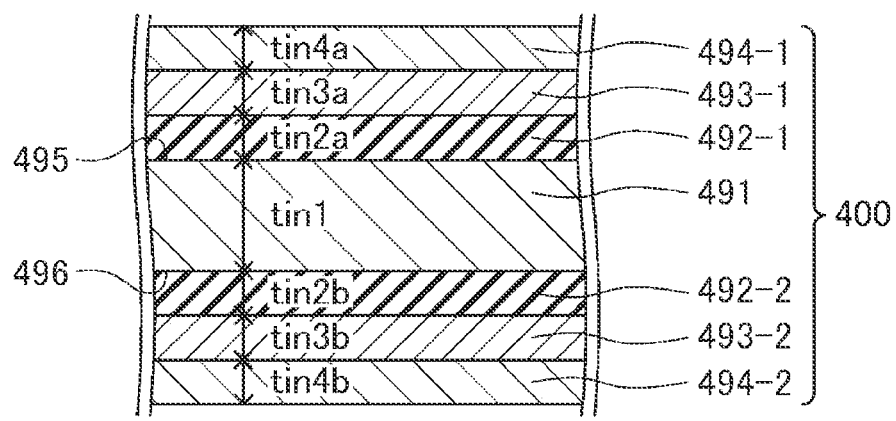
FIG. 16 is a diagram for explaining the configuration of a wiring substrate according to a second embodiment.

FIG. 16 is a diagram for explaining the configuration of the wiring substrate 400 according to the second embodiment.

As shown in FIG. 16, the wiring substrate 400 according to the second embodiment includes the base material 491, insulation layers 492-1 and 492-2, wiring layers 493-1 and 493-2, and protective layers 494-1 and 494-2. The insulation layer 492-1, the wiring layer 493-1, and the protective layer 494-1 are laminated toward the face 495 of the base material 491, and the insulation layer 492-2, the wiring layer 493-2, and the protective layer 494-2 are laminated toward the face 496 of the base material 491. That is, the wiring substrate 400 includes the wiring layer 493-2 laminated on the face 496 opposite to the face 495 of the base material 491, and the wiring layer 493-2 includes the wiring through which a signal different from a signal in the wiring included in the wiring layer 493-1 laminated on the face 495 of the base material 491 propagates.

The drive signal output circuit substrates 40a and 40b having the wiring substrate 400 configured as described above can have circuits and wires that constitutes the drive signal output circuits 51a and 51b on both the face 495 and the face 496 of the base material 491. Therefore, the wiring substrate 400 of the drive signal output circuit substrates 40a and 40b of the second embodiment can be downsized, compared with that of the first embodiment.

That is, in the liquid ejecting apparatus 1 and the drive signal output circuit substrates 40a and 40b in the second embodiment, the wiring substrate 400 included in the drive signal output circuit substrates 40a and 40b can be downsized in addition to the functions and effects of the liquid ejecting apparatus 1 and the drive signal output circuit substrates 40a and 40b of the first embodiment.

Here, the face 495 of the base material 491 is an example of a first face of the second embodiment, the face 496 is an example of a second face of the second embodiment, the wiring layer 493-1 is an example of a first layer of the second embodiment, and the wiring layer 493-2 is an example of a second layer of the second embodiment. The wire included in the wiring layer 493-1 is an example of a first propagation wire of the second embodiment, and the wire included in the wiring layer 493-2 is an example of a second propagation wire of the second embodiment.

The following contents are derived from the above-described embodiments and modifications.

An aspect of the liquid ejecting apparatus includes a liquid ejection head including a drive element, where the liquid ejection head ejects a liquid by a supply of a drive signal to the drive element, and a drive circuit that outputs the drive signal, wherein the drive circuit includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a base material and a first layer laminated on a first face of the base material, wherein the base material includes a metal, wherein the first layer includes a first propagation wire through which at least one of the amplified modulation signal and the drive signal propagates, and wherein the base material has a thickness greater than a thickness of the first layer.

According to the liquid ejecting apparatus, the substrate on which the modulation circuit, the amplifier circuit, and the demodulation circuit are provided includes a base material that is thicker than the first layer including the first propagation wire and that includes a metal having excellent thermal conductivity, so that the heat generated in the modulation circuit, the amplifier circuit, and the demodulation circuit is efficiently released through the base material. That is, the heat generated in the drive circuit can be efficiently released.

In an aspect of the liquid ejecting apparatus, the substrate may include a second layer laminated on a second face opposite to the first face of the base material, and wherein the second layer may include a second propagation wire through which a signal different from a signal propagating through the first propagation wire propagates.

According to the liquid ejecting apparatus, the substrate has a first layer including a first propagation wire, toward the first face of the base material, on which at least one of an amplified modulation signal and a drive signal propagates, and a second layer including a second propagation wire, toward the second face side opposite to the first face of the base material, on which a signal different from a signal propagating through the first propagation wire propagates. As a result, the effective area where the circuit can be mounted on the substrate is increased, and the substrate can be downsized while efficiently releasing the heat generated in the drive circuit.

In an aspect of the liquid ejecting apparatus, a ground signal indicating the reference potential of the drive circuit may be supplied to the base material.

According to the liquid ejecting apparatus, the ground potential is supplied to the base material that is thicker than the first layer and that includes a metal having excellent thermal conductivity, so that the ground potential can be stabilized while efficiently releasing the heat generated in the drive circuit.

In an aspect of the liquid ejecting apparatus, the drive circuit may include a relay circuit substrate electrically coupled to the substrate and relaying propagation of the drive signal to the liquid ejection head.

According to the liquid ejecting apparatus, the drive circuit includes the relay substrate electrically coupled to the substrate, so that it is possible to position, at the relay substrate, the circuit structure that generates a small amount of heat while releasing, from the substrate, the heat generated in the modulation circuit, the amplifier circuit, and the demodulation circuit, which generate a large amount of heat. Therefore, it is possible to reduce an area in which a substrate having a base material including a metal is used, and as a result, a cost of the substrate can be reduced, compared with a driver circuit constituted by only a substrate having a base material including a metal.

In an aspect of the liquid ejecting apparatus, the amplifier circuit may be positioned so as to overlap at least part of the base material in a direction normal to the first face.

According to the liquid ejecting apparatus, the base material including metal is positioned so as to overlap at least part of the amplifier circuit, so that it is possible to efficiently release the heat generated in the amplifier circuit that generates a large amount of heat.

In an aspect of the liquid ejecting apparatus, the demodulation circuit may be positioned so as to overlap at least part of the base material in a direction normal to the first face.

According to the liquid ejecting apparatus, the base material including metal is positioned so as to overlap at least part of the demodulation circuit, so that it is possible to efficiently release the heat generated in the demodulation circuit that generates a large amount of heat.

In an aspect of the liquid ejecting apparatus, the base material may include copper as the metal.

According to the liquid ejecting apparatus, the metal included in the base material is copper having excellent thermal conductivity, so that the heat generated in the drive circuit can be released more efficiently.

An aspect of the circuit substrate includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a base material and a first layer laminated on a first face of the base material, wherein the base material includes a metal, wherein the first layer includes a first propagation wire through which at least one of the amplified modulation signal and the drive signal propagates, and wherein the base material has a thickness greater than a thickness of the first layer.

According to the circuit substrate, the substrate on which the modulation circuit, the amplifier circuit, and the demodulation circuit are provided includes the base material that is thicker than the first layer including the first propagation wire and that includes a metal having excellent thermal conductivity, so that the heat generated in the modulation circuit, the amplifier circuit, and the demodulation circuit is efficiently released through the base material. That is, the heat generated in the drive circuit can be efficiently released.

The embodiments and the modifications have been described above, but the present disclosure is not limited to these embodiments and modifications. It is possible to implement the present disclosure in various aspects without departing from the gist thereof, and for example, the embodiments and the modifications can be combined appropriately.

The disclosure includes a configuration substantially same as the configuration described in the embodiments and the modifications (for example, a configuration having the same function, method, and result, or a configuration having the same object and effect). Further, the disclosure includes a configuration in which a non-essential part of the configuration described in the embodiments and the modifications is replaced. Further, the disclosure includes a configuration having the same functions and effects as the configuration described in the embodiments and the modifications or a configuration capable of achieving the same object. Further, the disclosure includes a configurations in which known techniques are added to the configurations described in the embodiments and the modifications.

What is claimed is:

1. A liquid ejecting apparatus comprising:
a liquid ejection head including a drive element, the liquid ejection head ejecting a liquid by a supply of a drive signal to the drive element; and
a drive circuit that outputs the drive signal,
the drive circuit including
a circuit substrate having
a modulation circuit that modulates a base drive signal to output a modulation signal,
an amplifier circuit that amplifies the modulation signal to output an amplified modulation signal,
a demodulation circuit that demodulates the amplified modulation signal to output the drive signal,
a substrate on which the modulation circuit, the amplifier circuit, and the demodulation circuit are provided, the substrate including a base material and a first layer laminated on a first face of the base material, the base material including a metal, and
a relay circuit substrate electrically coupled to the substrate and relaying propagation of the drive signal to the liquid ejection head, the relay circuit substrate including a wiring substrate and a connector that is disposed on one surface of the wiring substrate and that has a concaved portion concaved in a direction parallel to the one surface of the wiring substrate,
the circuit substrate being detachably coupled to the relay circuit substrate such that one part of the substrate is inserted into the concaved portion, and such that a different part of the substrate, which is different from the one part of the substrate, is spaced apart from the one surface of the wiring substrate via a spacer, the first layer including a first propagation wire through which at least one of the amplified modulation signal and the drive signal propagates, and the base material having a thickness greater than a thickness of the first layer.

2. The liquid ejecting apparatus according to claim 1, wherein the substrate includes a second layer laminated on a second face opposite to the first face of the base material, and wherein the second layer includes a second propagation wire through which a signal different from a signal propagating through the first propagation wire propagates.

3. The liquid ejecting apparatus according to claim 1, wherein a ground signal indicating a reference potential of the drive circuit is supplied to the base material.

4. The liquid ejecting apparatus according to claim 1, wherein the amplifier circuit is positioned so as to overlap at least part of the base material in a direction normal to the first face.

5. The liquid ejecting apparatus according to claim 1, wherein the demodulation circuit is positioned so as to overlap at least part of the base material in a direction normal to the first face.

6. The liquid ejecting apparatus according to claim 1, wherein the base material includes copper as the metal.

7. A circuit substrate comprising:

a modulation circuit that modulates a base drive signal to output a modulation signal;

an amplifier circuit that amplifies the modulation signal to output an amplified modulation signal;

a demodulation circuit that demodulates the amplified modulation signal to output a drive signal; and a substrate on which the modulation circuit, the amplifier circuit, and the demodulation circuit are provided, the substrate including a base material and a first layer laminated on a first face of the base material, the base material including a metal, the first layer including a first propagation wire through which at least one of the amplified modulation signal and the drive signal propagates, and the base material having a thickness greater than a thickness of the first layer, the circuit substrate being detachably coupled to a relay circuit substrate that is electrically coupled to the substrate, relays propagation of the drive signal, and includes a wiring substrate and a connector which is disposed on one surface of the wiring substrate and which has a concaved portion concaved in a direction parallel to the one surface of the wiring substrate, the circuit substrate being detachably coupled to the relay circuit substrate such that one part of the substrate is inserted into the concaved portion, and such that a different part of the substrate, which is different from the one part of the substrate, is spaced apart from the one surface of the wiring substrate via a spacer.

* * * * *